United States Patent
Staszewski et al.

(10) Patent No.: US 7,519,135 B2
(45) Date of Patent: Apr. 14, 2009

(54) DIRECT RADIO FREQUENCY (RF) SAMPLING WITH RECURSIVE FILTERING METHOD

(75) Inventors: Robert B. Staszewski, Garland, TX (US); Khurram Muhammad, Richardson, TX (US); Kenneth J. Maggio, Dallas, TX (US); Dirk Leipold, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1152 days.

(21) Appl. No.: 10/190,867

(22) Filed: Jul. 8, 2002

(65) Prior Publication Data

US 2003/0035499 A1      Feb. 20, 2003

Related U.S. Application Data

(60) Provisional application No. 60/312,602, filed on Aug. 15, 2001, provisional application No. 60/313,772, filed on Aug. 20, 2001, provisional application No. 60/348,902, filed on Oct. 26, 2001.

(51) Int. Cl.
*H03K 5/01* (2006.01)

(52) U.S. Cl. .................................................... 375/346
(58) Field of Classification Search ................. 375/316, 375/334, 336, 337, 346
See application file for complete search history.

(56) References Cited

U.S. PATENT DOCUMENTS

| | | | | |
|---|---|---|---|---|
| 5,825,230 A | * | 10/1998 | Chen et al. ................... | 327/337 |
| 7,057,540 B2 | * | 6/2006 | Muhammad et al. ......... | 341/143 |
| 2003/0040294 A1 | * | 2/2003 | Staszewski et al. ......... | 455/337 |

* cited by examiner

*Primary Examiner*—Kevin M Burd
(74) *Attorney, Agent, or Firm*—Ronald O. Neerings; Wade James Brady, III; Frederick J. Telecky, Jr.

(57) ABSTRACT

A radio receiver 2000 with a sampling mixer 1100 for creating a discrete-time sample stream by directly sampling an RF current with history and rotating capacitors 1111 and 1112, wherein the accumulated charge on the rotating capacitors is read-out to produce a sample. The mixer provides immunity to noise glitches by predicting the occurrence of the glitch (or detecting a significant difference between observed and predicted samples) and creating corrected samples for the corrupted samples. These corrected samples can be created with special circuitry 1933 (digital) or in the mixer 1100 (analog).

32 Claims, 17 Drawing Sheets

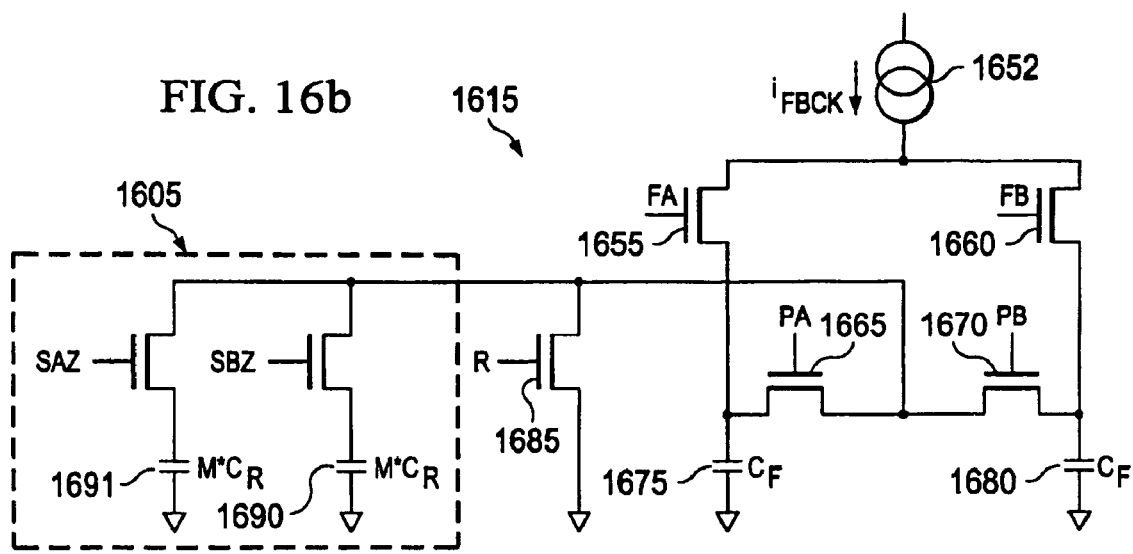
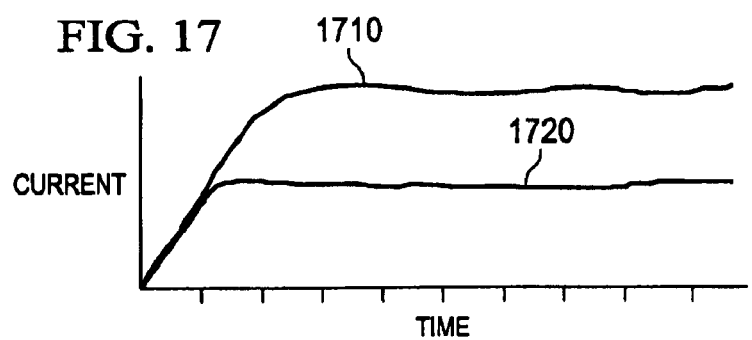
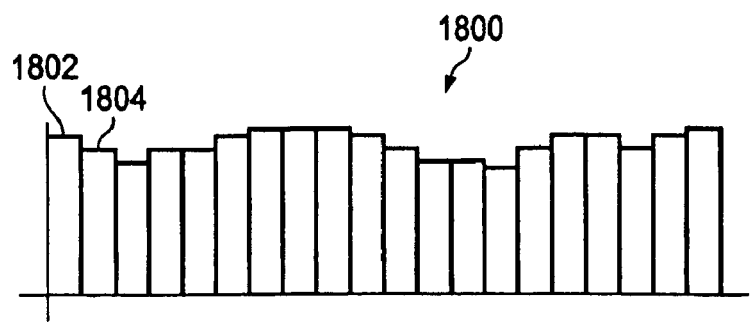

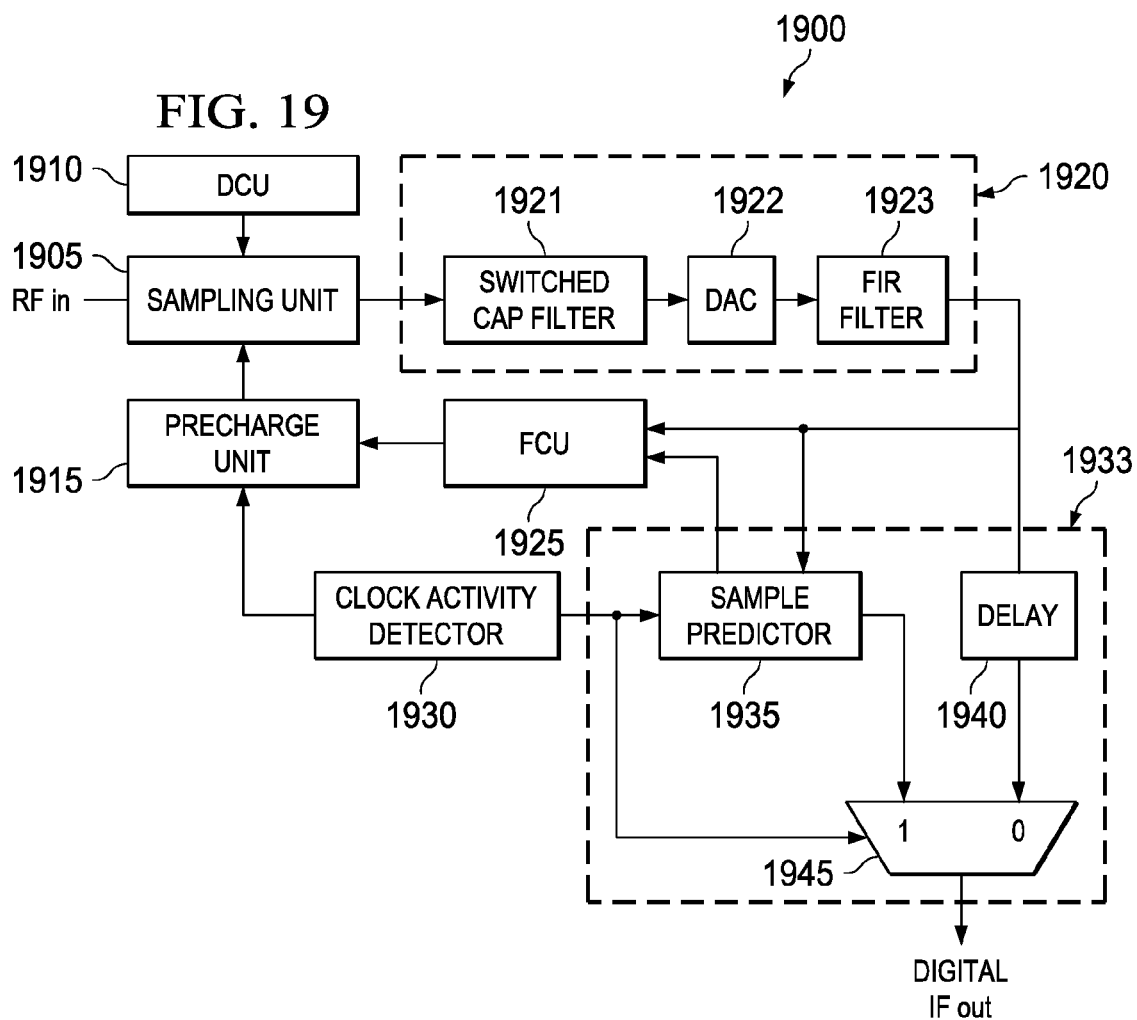
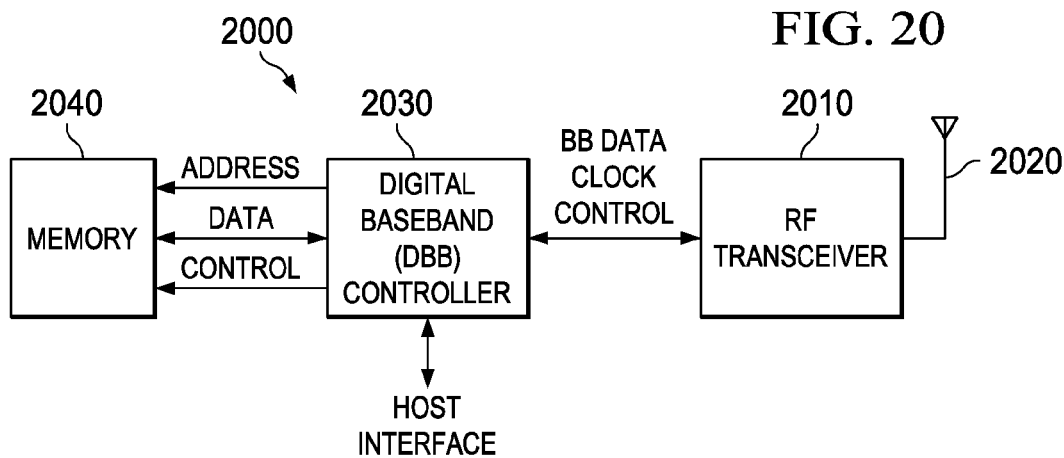

DIRECT RADIO FREQUENCY (RF) SAMPLING WITH RECURSIVE FILTERING METHOD

This application claims priority to provisional applications Ser. No. 60/312,602, filed Aug. 15, 2001, and Ser. No. 60/313,772, filed Aug. 20, 2001 and Ser. No. 60/348,902, filed Oct. 26, 2001. Each of these provisional applications is assigned to the assignee of this application and is also incorporated herein by reference as if each of the applications was reproduced in its entirety herein.

FIELD OF THE INVENTION

This invention relates generally to wireless communications systems, and particularly to direct sampling of radio frequency signals and filtering of same.

BACKGROUND OF THE INVENTION

Discrete-time radio frequency (RF) is a newly emerging field in wireless digital communications wherein analog RF signals that are transmitted over-the-air are directly sampled into a discrete-time sample stream suitable for digital signal processing. A typical wireless digital communications device would use analog filters, duplexers, mixers, analog-to-digital converters (ADC), etc. to convert the analog RF signals into a digital data stream that is suitable for digital signal processing. Unfortunately, analog circuit components, especially components such as capacitors, inductors, resistors, etc. necessary for the analog filters are difficult to integrate into an integrated circuit. This is especially true for the precise values of these components required for use in filters. Of course, it is the desire of the manufacturer to maximize the degree of integration for the wireless transceivers. This is because the more highly integrated a wireless transceiver can become, the lower the production costs for the transceiver and the transceiver will typically use less power during operation.

Discrete-time RF involves the direct conversion of the analog RF signal into discrete-time sample stream through the use of a direct sampling mixer, without having to undergo any intermediate analog continuous-time filtering, downconversion, etc. An example of a direct RF sampling mixer is one that uses current to perform its sampling. The current-mode direct sampling mixer converts the received analog RF signal into a current that is then integrated by a sampling capacitor. The charge on the sampling capacitor is then periodically read to produce the discrete-time sample stream.

After reading the charge on the sampling capacitor, any residual charge remaining on the sampling capacitor may be optionally reset. A reason for resetting the charge on the sampling capacitor is to prevent the excessive accumulation of charge during the sampling phase to saturate (or deplete) the charge storage capacity of the sampling capacitor, thus resulting in loss of information. For example, should there be a relatively large charge already on the sampling capacitor when it begins to accumulate charge during the integrating phase, it is possible for the accumulated charge when combined with the existing charge to be above the maximum (or be below the minimum) amount of charge that may be stored on the sampling capacitor. Once the sampling capacitor becomes saturated or depleted, information is lost.

One commonly used technique for resetting the sampling capacitor is to short the sampling capacitor to electrical ground to remove any charge from the sampling capacitor and then applying a known current to the sampling capacitor for a known amount of time. This develops a known voltage onto the sampling capacitor. The known voltage is commonly referred to as a bias voltage and the operation of placing the bias voltage onto the sampling capacitor is known as a precharge operation.

A disadvantage of this technique is the amount of power consumed in bringing the sampling capacitor up to the bias voltage value. Each time that the sampling capacitor is brought from zero volts to the bias voltage value, a significant amount of current is consumed. If the precharge operation occurred only infrequently, then it is possible to overlook the power consumption. However, the precharge operation occurs after each sample is read out from the sampling capacitor and depending on the sampling rate, the precharge operation can occur very frequently. This leads to the consumption of a considerable amount of power. In many applications, such as portable and battery powered radios, power consumption is of vital concern and should be minimized when possible.

Additionally, many mixers work with more than one signal stream, i.e., the RF current is periodically integrated at various points in time to produce multiple sample streams. For example, it is fairly typical for a digital transceiver to process the received signal stream as two separate streams, an in-phase (I) stream and a quadrature-phase (Q) stream. Additionally, many use differential signaling, wherein a portion of each signal is received along with a portion of the same signal that is 180 degrees out of phase. Therefore, the mixers can be quite complex, with four separate signal paths.

A significant disadvantage of having four separate signal paths in the mixer stems from the fact that each signal path requires a different clock. For example, the clock for a positive I stream will differ from the clock for a positive Q stream by 90 degrees and the clock for a positive stream will differ from the clock for a negative stream by 180 degrees. Since the clocks typically differ from one another by a phase angle, it is common for each signal path will have its own clock generation hardware.

One possible solution to providing separate clocks to each signal path is to provide each signal path with its own local oscillator (LO) generating a signal of desired period with the proper timing and then a series of clock dividers to generate clocks of the proper frequency from the signal generated by the LO. However, the use of a different LO for each signal path can result in synchronization problems due to frequency differences in the signals generated by the different LOs, resulting in a degraded downconverted signal. Alternatively, there may be a single LO, whose signal is fed to each of the signal paths and each signal path has its own clock generating hardware that would take the signal from the LO and derive the necessary clock signals. Regardless of whether a single LO or multiple LOs are used, there is typically a separate set of clock generating hardware for each signal path.

A major disadvantage in having separate clock generating hardware for each signal path is power consumption. As expected, the clock generating hardware must also be clocked at high frequencies and hardware clocked at high frequencies consumes more power than hardware clocked at low frequencies. Also for more complex clocking schemes, a large amount of hardware is required for the clock generating hardware. The clocking at high operating frequencies and the redundancy of the generating hardware results in a significant amount of power consumption. For example, in a mixer with four signal paths, four complete sets of clock generating hardware are required. An additional disadvantage is that the redundant clock generating hardware also requires a lot of real estate when it comes time to integrate the mixer hardware into an integrated circuit. The increased real estate results in a larger, more expensive device.

It is fairly typical that after a discrete-time sample stream has been produced by the mixer that the sample stream is to receive digital signal processing via processing elements and/ or digital signal processors. The processing of the discrete-time sample stream, once it is converted into a digital bit stream, by processing elements and digital signal processors, etc., can inject a significant amount of noise into the current-mode mixer. The noise being a by-product of the high frequency (usually) clocks of the processing elements and the digital signal processors. If unattended to, the noise can have serious effects on the overall performance of the current-mode mixer and the entire device.

Although the bursts of digital activity may be only several nano-seconds in duration, the digital noise that is created by the bursts of activity may be periodic in nature and be of significant magnitude. It is the periodic nature of the noise along with its impulse-like response that can degrade the overall performance of both the mixer and the digital device through the injection of a significant amount of noise into the discrete-time sample stream.

A standard technique for noise suppression in integrated circuits is through the use of metal rings and deep wells placed onto the silicon substrate. The metal rings and deep wells are typically placed around the noise sources and/or noise-sensitive analog circuits. Unfortunately, the rings and wells cannot prevent noise that is carried on signal lines and power planes. Additionally, the use of rings and wells may increase the overall cost of the integrated circuit, due to the requirement for additional steps in the fabrication process and increased complexity in the design of the integrated circuit itself.

A need has therefore arisen for a mixer that can produce a clean discrete-time sample stream from an RF source with minimum power consumption and increased noise immunity.

SUMMARY OF THE INVENTION

In one aspect, the present invention provides a method for glitch suppression in a discrete-time sample stream comprising the steps of predicting an occurrence of a glitch, generating a marker signal, creating a corrected sample, and placing the corrected sample into the discrete-time sample stream.

In another aspect, the present invention provides a circuit comprising a history capacitor and a rotating capacitor, both coupled to a radio frequency (RF) input, the history and rotating capacitors to integrate an RF current provided by the RF input to produce a charge on the history and rotating capacitors, a read-out circuit coupled to the history and rotating capacitors, the read-out circuit to measure the charge on the rotating capacitor, and a timing circuit coupled to the history and rotating capacitors and the read-out circuit, the timing circuit to produce clock signals to control the operation of the history and rotating capacitors and the read-out circuit.

In yet another aspect, the present invention provides a radio receiver comprising a radio frequency (RF) input to receive RF signals, a sampling mixer coupled to the RF input to produce a discrete-time sample stream, and the sampling mixer comprising a history capacitor and a rotating capacitor, both coupled to a radio frequency (RF) input, the history and rotating capacitors to integrate an RF current provided by the RF input to produce a charge on the history and rotating capacitors, a read-out circuit coupled to the history and rotating capacitors, the read-out circuit to measure the charge on the rotating capacitor, a timing circuit coupled to the history and rotating capacitors and the read-out circuit, the timing circuit to produce clock signals to control the operation of the history and rotating capacitors and the read-out circuit, and the radio receiver further comprising a signal processing unit coupled to the mixer, the signal processing unit containing circuitry to process the output of the sampling mixer and create user usable data.

In yet another aspect, the present invention provides a method for creating a discrete-time sample stream (DTSS) comprising the steps of receiving a radio frequency (RF) signal, creating a charge packet from the RF signal, accumulating the charge packets on a history capacitor and a rotating capacitor, measuring the accumulated charge on the rotating capacitor after a specified number of periods, and producing a discrete-time sample based on the measured charge.

The present invention provides a number of advantages. For example, use of a preferred embodiment of the present invention allows the use of a single clock signal generated by one local oscillator in the generation of multiple clock signals, each with a different phase angle, rather than using different clock signals generated by the local oscillator in conjunction with separate clock generating hardware for each different lower frequency clock signal with a different phase angle. This results in a significant reduction in the amount of clock generating hardware, leading to a reduction in the overall size of the integrated wireless transceiver.

Also, use of a preferred embodiment of the present invention reduces power consumption of the overall wireless transceiver by reducing the clock generating hardware. The reduction in the power consumption increases battery life (or reduces the size of a power supply) and decreases heat dissipation concerns.

Additionally, use of a preferred embodiment of the present invention reduces the overall amount of hardware that needs to be integrated into an integrated circuit. By reducing the hardware requirements, it is possible to create a smaller radio transceiver. A smaller radio transceiver leads to a smaller, less expensive product.

Also, the use of a preferred embodiment of the present invention allows the sampling capacitor to be brought to a prespecified bias voltage while consuming only a small amount of power. This low power consumption increases battery life (or reduces the size of a power supply) and decreases heat dissipation concerns.

Additionally, use of a preferred embodiment of the present invention permits adjustments to be made to the amount of current used to bring the sampling capacitor to a prespecified bias voltage. For example, due to manufacturing (fabrication) variations, the actual value of the sampling capacitors may vary (sometimes significantly) from its nominal value. Therefore, a fixed current will place a bias voltage on the sampling capacitor that differs from the specified value. Use of a preferred embodiment of the present invention permits the charging current to be adjusted to place precisely the desired amount of bias voltage on the sampling capacitors.

Also, use of a preferred embodiment of the present invention reduces the overall noise injected into the system. The noise reduction is due to fact that each time a current is injected into the system, noise is also injected into the system. Since less current is injected into the system, less noise is injected into the system.

Additionally, use of a preferred embodiment of the present invention further reduces the overall noise in the system by slowing down the sampling clock when there is a significant amount of digital noise expected. Because a synthesizer is used to generate the signals for the local oscillator, it is possible to predict the occurrence of digital noise. At such predicted times, it is possible to slow down the sampling clock to prevent the feeding through of noise from the digital portion of the digital device onto the discrete-time sample stream. Extrapolation, interpolation, or linear prediction of adjacent sample values may also be used in place of slowing down the sampling clock.

Also, use of a preferred embodiment of the present invention can reduce the effect of the overall noise in the system by stopping the sampling of the input signal. By stopping the sampling of the input signal, noise generated by a digital circuit is not combined with the input signal into a discrete-time sample stream. Due to the use of sampling capacitors that retains their accumulated charge for an extended period of time, the samples that occur during the period of digital noise may be replaced with samples of the input signal already sampled by the sampling capacitors, which are free of the digital noise.

BRIEF DESCRIPTION OF THE DRAWINGS

The above features of the present invention will be more clearly understood from consideration of the following descriptions in connection with accompanying drawings in which:

FIG. 13 illustrates the phase angle differences between rotating capacitor-activating signals in the various signal paths of the current-mode sampling mixer of FIG. 6a;

FIGS. 16a and 16b illustrate a high-level view of a current-mode sampling mixer system 1600 and a detailed view of a feedback control unit according to a preferred embodiment of the present invention;

FIG. 17 illustrates a plot of current needed to place a bias voltage of a specified amount on a bank of rotating capacitors when the capacitors have been completely discharged and when they are partially discharged according to a preferred embodiment of the present invention;

FIGS. 18a-d illustrate a discrete-time sample stream with a noise glitch and the same discrete-time sample stream after two different noise glitch correction algorithms have corrected the affected samples according to a preferred embodiment of the present invention;

FIG. 19 illustrates a high-level view of a current-mode sampling mixer system 1900 with built-in glitch suppression circuitry according to a preferred embodiment of the present invention; and FIG. 20 illustrates a block diagram of a wireless communications device containing a direct sampling mixer according to a preferred embodiment of the present invention.

DETAILED DESCRIPTION OF ILLUSTRATIVE EMBODIMENTS

The making and use of the various embodiments are discussed below in detail. However, it should be appreciated that the present invention provides many applicable inventive concepts, which can be embodied in a wide variety of specific contexts. The specific embodiments discussed are merely illustrative of specific ways to make and use the invention, and do not limit the scope of the invention.

The following discussion focuses on a particular type of radio receiver mixer and its circuitry that is operating in a 2.4 Gigahertz frequency band and is adherent to the Bluetooth technical standards. The Bluetooth technical standard specifies a short-range wireless communications network whose intended purpose is a low-power and low-cost replacement for physical cabling. The Bluetooth technical standard is specified in a document entitled "Specification of the Bluetooth System, Version 1.1, Feb. 22, 2001," which is incorporated herein by reference. While the discussion focuses on Bluetooth radios, the present invention is operable in other frequency bands and other technical standards; therefore, the discussion should not be construed as limiting the present invention to Bluetooth transceivers operating at 2.4 Gigahertz. For example, the present invention has application in global positioning systems (GPS), low-earth orbit satellite system based communications systems and cellular based communications systems. The cellular based systems may include first, second, and third generation (and beyond) digital phone systems, time-division multiple access (TDMA), code-division multiple access (CDMA), global system for mobile communications (GSM) technology along with other digital communications technologies operating at various carrier frequencies. Additionally, the receiver mixer of the present invention has application in wired receivers as well.

Figure 1A:
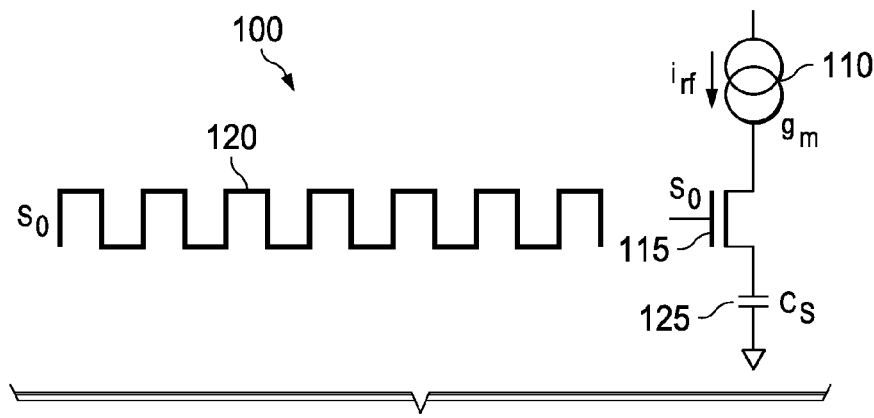
FIGS. 1a and 1b illustrate prior art embodiments of current-mode sampling mixers.

Referring now to FIG. 1a, a block diagram illustrates a prior art embodiment of a current-mode direct sampling mixer 100. The mixer 100 includes an amplifier 110 (sometimes referred to as a low-noise transconductance amplifier (LNTA)), an RF switch 115 driven by a signal 120 generated by a local oscillator (not shown), and a sampling capacitor (Cs) 125. An alternative version of the mixer 100 exists wherein an antenna (not shown) is coupled to the amplifier, the antenna is used to receive analog RF signals transmitted over-the-air. The direct electrical coupling provides a direct signal path from the antenna into the mixer 100.

An analog RF signal that is provided to the mixer 100 (the analog RF signal may be provided to the mixer 100 via a direct wire or cable connection or transmitted over-the-air) in the form of an RF voltage that is then converted into an RF current by the LNTA 110, which has a transconductance gain of $g_m$. The flow of the RF current is switched by the RF switch 115, which is driven by the signal 120 generated by a local oscillator (LO). The frequency of the signal 120 is referred to as a sampling frequency and is commonly denoted $f_s$. The sampling frequency is normally approximately equal to the frequency used to create the analog RF signal.

Figure 1B:
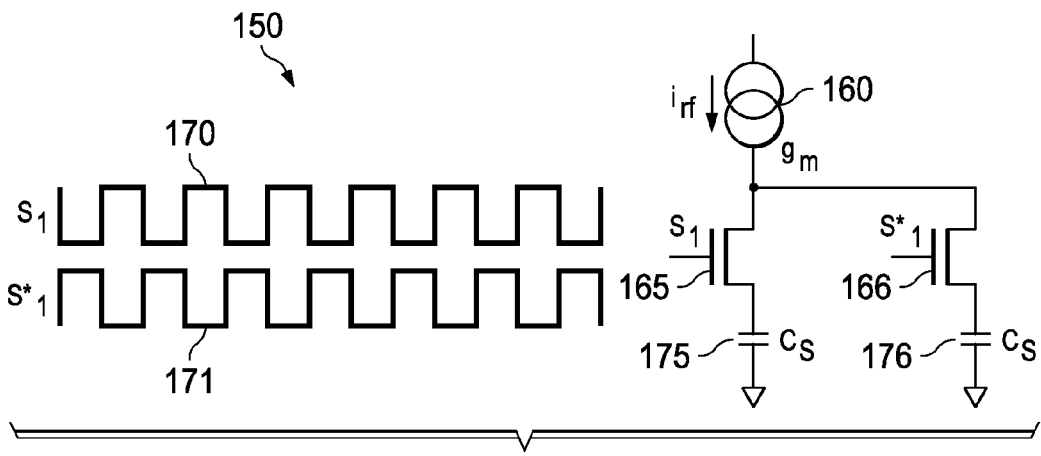

As displayed in FIG. 1a, when the signal 120 is high, the RF switch 115 is closed, creating a path for the RF current. The RF current is integrated by the sampling capacitor 125, increasing (or decreasing) the charge on the sampling capacitor 125, depending on the direction of the current flow. It is possible to view the integration of the RF current by the sampling capacitor 125 conceptually as the injection of an electrical charge packet that is proportional to the windowed (or gated) RF energy into the sampling capacitor 125. These electronic charge packets increase (or decrease) the charge on the sampling capacitor 125 depending on the charge polarity. In order to fully sample the analog RF signal, an identical current-mode sampling mixer with an RF switch that is driven by an inverse (or complement) of the signal generated by the LO is used. The identical current-mode sampling mixer is used to sample the analog RF signal when the current-mode sampling mixer 100 is decoupled from the LNTA 110 by the RF switch 115 when the signal 120 is low, as shown in FIG. 1b.

The charge that is integrated on the sampling capacitor 125 is periodically read out to produce a single sampled data value. The frequency of the charge read out can vary from being equal to the frequency of the signal 120 to some integer divisor of the frequency of the signal 120. The periodic reading out of the charge on the sampling capacitor 125 produces a discrete-time sample stream of the analog RF signal.

Unfortunately, when the charge on the sampling capacitor 125 is being read out, the sampling capacitor 125 cannot be used to integrate the RF current, or vice versa. Therefore, the current-mode sampling mixer 100 as displayed in FIG. 1a does not permit the reading of the charge accumulated on its sampling capacitor 125 while the signal 120 is actively switching. Also, the amount of time required to read the charge from the sampling capacitor 125 is typically longer than the amount of time to integrate the RF current, i.e., half of the period of the signal 120. Therefore, it is normally not feasible to attempt a charge read out while the signal 120 is inactive.

Notice that the switches, both RF and non-RF switches, displayed in the figures and discussed in this specifications are displayed as n-type metal oxide semiconductor (NMOS) transistor switches. However, these switches may be made out p-type metal oxide semiconductor (PMOS) or complementary metal oxide semiconductor (CMOS) transistor pass gates as well without loss in performance or generality. Of course, the use of other types of switches may require minor rearrangements of the mixers. For example, the use of PMOS switches would require that the coupling be tied to Vdd (the substrate power source) rather than the substrate ground as the figures in this specifications display. However, the rearrangements are minor and are well understood by those of ordinary skill in the art of the present invention.

Figure 2:
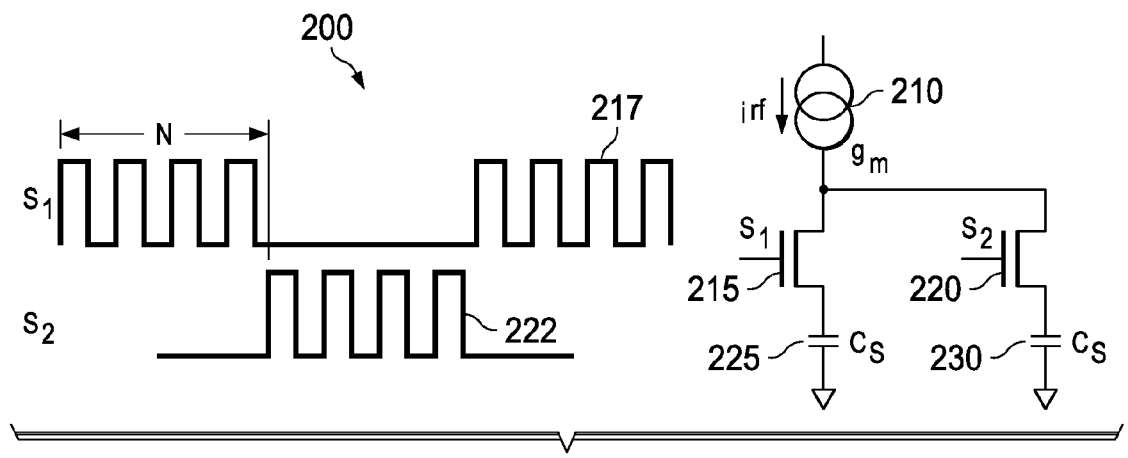
FIG. 2 illustrates a prior art embodiment of a current-mode sampling mixer with cyclic charge read out.

Referring now to FIG. 2, a block diagram illustrates a prior art embodiment of the current-mode sampling mixer 200 with cyclic charge read out. The mixer 200 is essentially the same as the mixer 150 of FIG. 1b. When more than one sampling capacitor is used, the current-mode sampling mixer is sometimes referred to as a multi-tap direct sampling mixer (MTDSM). A second RF switch 220 and sampling capacitor 230 pair allows the task of integrating the RF current to be shared between two sampling capacitors 225 and 230. The RF switches, S1 215 and S2 220, are driven by signals 217 (for switch S1) and 222 (for switch S2). The signals 217 and 222 may be thought of as portions of the signal generated by the LO. For example, the signal 217 may be configured to gate the signal produced by the LO for N cycles and then remain low for the next N cycles and return to gating the LO signal for the next N cycles. The number N is equal to the number of RF cycles the sampling capacitors will integrate the RF current. When the two signals 217 and 222 are combined, the result is the original signal produced by the LO.

When one signal (217 or 222) is gating the signal produced by the LO, the RF switch (215 or 220, respectively) that is controlled by the signal alternates between being closed and open, permitting the RF current to flow to the respective sampling capacitor. When one signal (217 or 222) is gating the signal produced by the LO, the other signal (222 or 217) is low, and the switch associated with the signal is open, not permitting any RF current to reach the sampling capacitor. While one sampling capacitor is busy integrating the RF current, the second sampling capacitor is not integrating the RF current and therefore its charge can be read out. The roles are then reversed to allow the reading of the charge integrated by the first sampling capacitor to be read out. If the capacitance of each of the sampling capacitors is $C_S$, then at any given time, the capacitance seen by the RF current remains $C_S$ because the RF current only sees one sampling capacitor at a time (due to the nature of the signals 217 and 222).

This periodic integration of a number of half-rectified RF samples performs a finite-impulse response (FIR) filtering operation and is sometimes referred to as a temporal moving average (MA). For example, if the number of half-rectified RF samples being integrated in each period is N, then the operation is referred to as a moving average N, or MA-N. The MA-N operation corresponds to an FIR filtering operation with N coefficients, with all coefficients being unity. The FIR filtering operation can be expressed in equation form as:

$$w_i = \sum_{l=0}^{N-1} u_{i-l}$$

Where: $u_i$ is the i-th RF sample and $w_i$ is the accumulated charge on the sampling capacitor. Due to the fact that the MA-N operation is being read out at the lower rate of once per N RF cycles, aliasing occurs with a foldover frequency at $f_0/2N$. FIR filtering and MA-N operations are considered well understood by those of ordinary skill in the art of the present invention and will not be discussed in detail in these specifications.

The current-mode sampling mixer can be further modified to perform an infinite-impulse response (IIR) filtering operation. IIR filtering operations are usually considered to be stronger filtering operations than FIR filtering operations. Therefore, IIR filtering operations are generally more preferred. IIR filtering operations are considered well understood by those of ordinary skill in the art of the present invention and will not be discussed in detail in these specifications.

Figure 3:
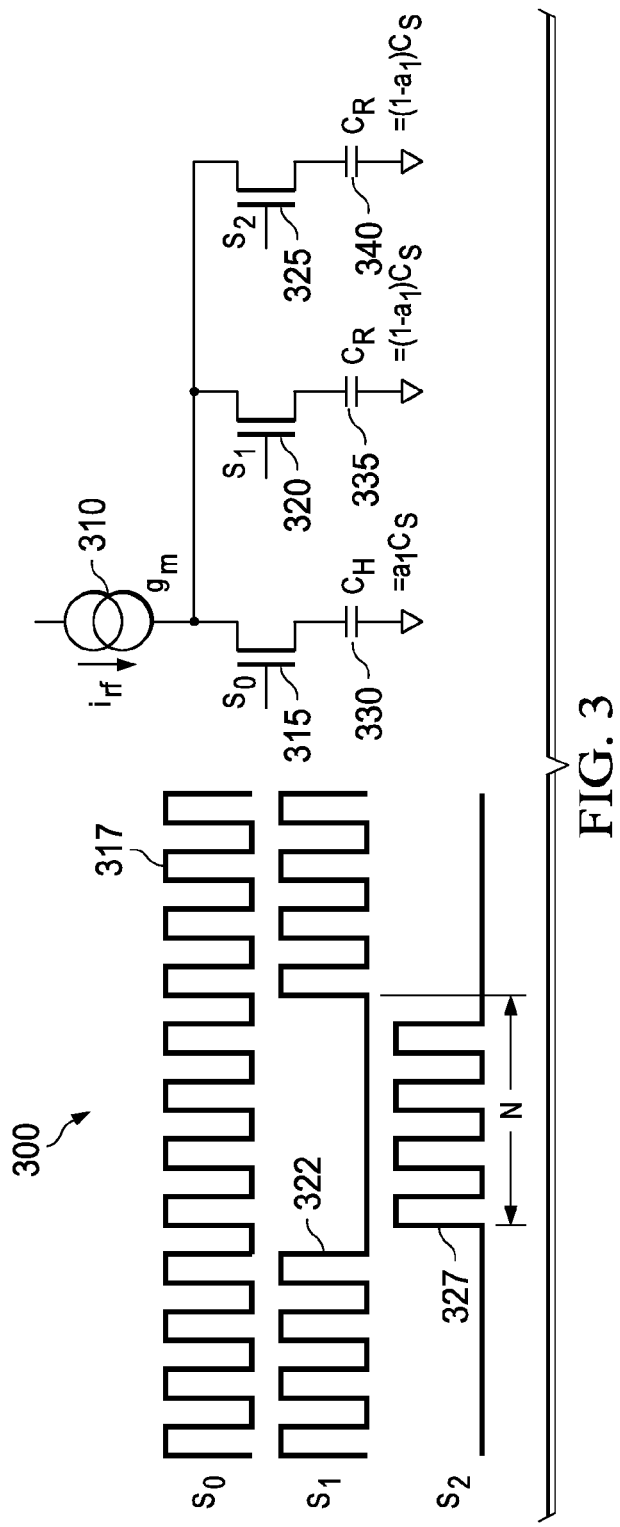
FIG. 3 illustrates a current-mode sampling mixer with recursive operation to provide infinite-impulse response filtering according to a preferred embodiment of the present invention.

Referring now to FIG. 3, a block diagram illustrates a current-mode sampling mixer 300 with recursive operation to provide IIR filtering according to a preferred embodiment of the present invention. According to a preferred embodiment of the present invention, the current-mode sampling mixer 300 uses two different types (in terms of capacitive value) of sampling capacitors. A first type of sampling capacitor is referred to as a history capacitor, denoted $C_H$, and is used to store the "history" of the RF current. According to a preferred embodiment of the present invention, the history capacitor always integrates the RF current, meaning that with exception of the negative half-cycle, the history capacitor continually integrates the RF current. A second type of sampling capacitor is referred to as a rotating capacitor, denoted $C_R$, and is used to periodically integrate the RF current in a manner similar to the sampling capacitors discussed in FIG. 2. Unlike the mixer 200 in FIG. 2, wherein the actual capacitive value of the sampling capacitors was not crucial as long as the sampling capacitors all had the same values, the values of the history and rotating capacitors in the mixer 300 is important. In actuality, the capacitive value of the sampling capacitors in FIG. 2 is used for determining the gain of the sampling operation, but is not vital to the proper operation of the mixer 200.

According to a preferred embodiment of the present invention, the value of the history capacitor is $a_1 * C_S$, where $C_S$ is the value of the sampling capacitor used in the mixer of FIG. 2 and $a_1$ is a constant. Given that the history capacitor has a specified value of $a_1 * C_S$, then it is preferred (for reasons that will be discussed below) that each of the rotating capacitors have a value of $(1-a_1) * C_S$. It is preferred that the ratio of $C_H$ to $C_R$ be approximately 30, although ratios greater than 30 also result in efficiently operating mixers. As an example, a preferred value for $a_1$ may be 0.9686. Therefore $C_H$ is approximately thirty one (31) times the value of each one of the $C_R$ capacitors, $C_H/C_R \cong 31$.

The mixer 300, as displayed in FIG. 3, has three RF switches 315, 320, and 325. The RF switches are driven by signals 317, 322, and 327 respectively. The signal 317 is the signal generated by the LO while signals 322 and 327 are gated versions of signal 317, similar to signals 217 and 222 from FIG. 2. Therefore, at any given instance in time, the RF current is being integrated by the history capacitor ($C_H$) and one of the two rotating capacitors ($C_R$). Since the capacitance of the history capacitor is $a_1 * C_S$ and that of the rotating capacitor is $(1-a_1)*C_S$, then the RF current sees an overall capacitance of $a_1 * C_S + (1-a_1)*C_S = C_S$. This is the same capacitance seen by the RF current in the mixer 200 displayed in FIG. 2.

According to a preferred embodiment of the present invention, if there are more than two rotating capacitors, it is possible to have more than one rotating capacitor coupled to the history capacitor for purposes of integrating the RF current.

Assuming that each rotating capacitor is active for N cycles, the IIR filtering is arrived at in the following manner: the RF current is integrated over N RF cycles, with the charge being shared on both the history and the active rotating capacitor. The amount of charge on the respective capacitors is proportional to their capacitance. At the end of an N cycle accumulation period, the active rotating capacitor stores $(1-a_1)$ of the total charge, stops further integration, and prepares for reading out its charge. The formerly inactive rotating capacitor joins the history capacitor in the integration process and at the same time obtains $(1-a_1)$ of the charge stored on the $C_H$ capacitor (assuming that the formerly inactive rotating capacitor had no initial charge). If the input charge integrated over the most recent N cycles is $w_j$, then the charge $s_j$ stored in the system at sampling time j can be described as a single-pole recursive IIR equation:

$$s_j = a_1 * s_{j-1} + w_j$$

and the output charge $x_j$ is $(1-a_1)$ times the system charge of the most recent cycle. This is a discrete-time IIR filter operating at $f_0/N$ sampling rate and possesses a single pole, where $f_0$ is the frequency of the signal generated by the LO.

When operating at high frequencies, for example, if the wireless transceiver is designed for use as Bluetooth transceiver, the operating frequency ($f_0$) is 2.4 Gigahertz and if N=8, then the read out frequency is $f_0/N$ or 300 MHz. Although significantly smaller than 2.4 GHz, 300 MHz remains a very high frequency when it comes to reading out the charge on the rotating capacitors; therefore, it is desired to relax the read out time even more. In addition to increasing the value of N, one way that the period of the read out time may be further increased is by adding additional rotating capacitors, $C_R$, and then reading the charge stored on one of the rotating capacitors while the remaining capacitors continue integrating the RF current.

Figure 4A:
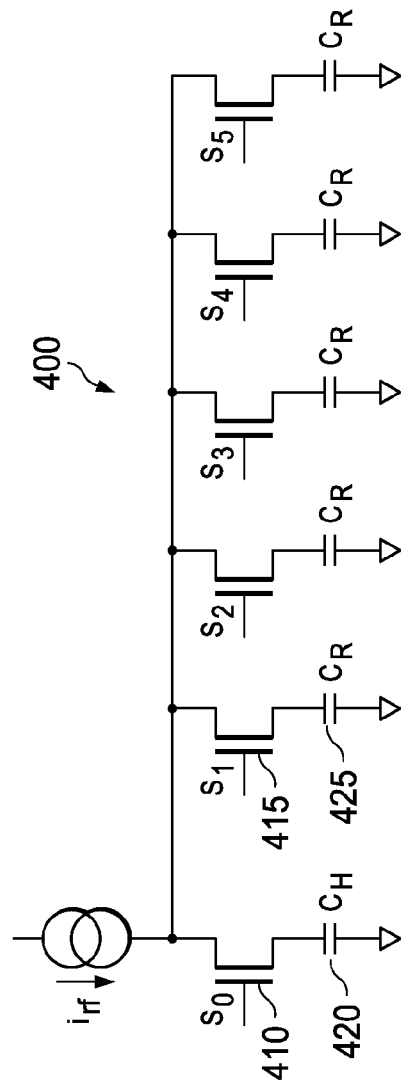
FIGS. 4a and 4b illustrate the use and timing of rotating capacitors in a current-mode sampling mixer to increase (relax) the charge read out time according to a preferred embodiment of the present invention.

Referring now to FIG. 4a, a block diagram illustrates the use of five rotating capacitors in a current-mode sampling mixer 400 to increase the charge read out time according to a preferred embodiment of the present invention. The mixer 400 is identical to the mixer displayed in FIG. 3, with the exception of three additional rotating capacitors and RF switches. The mixer 400 has a redundancy of 4 (the total number of rotating capacitors minus one (5−1=4)). The RF switches for the rotating capacitors (RF switches S1, S2, S3, S4, and S5) are driven by signals designed so that only one of the RF switches is active at a given time. An RF switch 410, S0, controls the history capacitor and is driven by a signal generated by the LO, making it active at all times.

As discussed previously, it is possible to have more than one rotating capacitor coupled to the history capacitor as it is integrating the RF current. The analysis of the use of two (or more) rotating capacitors is identical to the case where only one rotating capacitor is coupled to the history capacitor if the two (or more) rotating capacitors are combined into a single capacitor.

One of the five rotating capacitors is chosen to have its charge read out. The charge read out cycle may be as long in duration as the integration time of the four remaining rotating capacitors, hence providing a larger amount of time (when compared to the integration time of a single rotating capacitor) to extract the charge stored on the selected rotating capacitor.

Figure 4B:
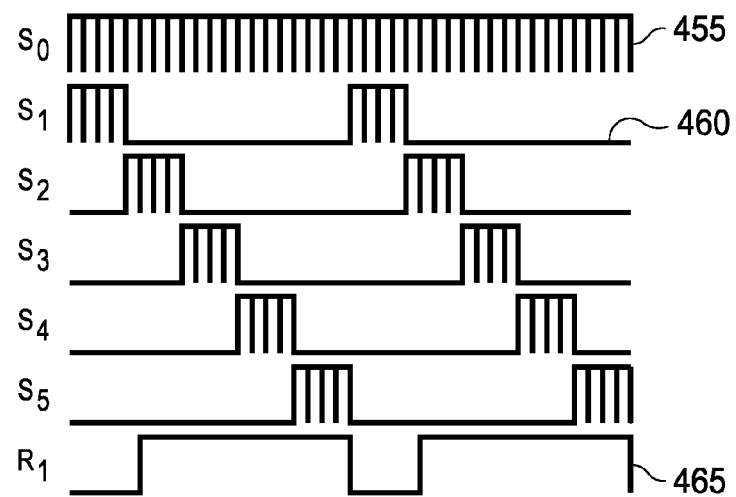

Referring now to FIG. 4b, a timing diagram illustrates the signals driving the various RF switches in the mixer 400 and a charge read out cycle according to a preferred embodiment of the present invention. A first timing trace 455 displays the signal generated by the LO, used to drive the RF switch, S0 (410 from FIG. 4*a*), while a second timing trace 460 displays the signal used to drive the RF switch, S1 (415 from FIG. 4*a*). Similar traces display the signals driving the remaining RF switches. A timing trace 465 represent the charge read out cycle. According to a preferred embodiment of the present invention, when the timing trace 465 is high, the charge read out cycle is active and the charge collected on the selected rotating capacitor is being read out. As displayed in FIG. 4*b*, the selected rotating capacitor is the capacitor associated with the RF switch, S1 (415 in FIG. 4*a*). Notice that the charge read out cycle (trace 465) is inactive when the RF switch S1 is active, permitting the rotating capacitor to integrate the RF current.

According to a preferred embodiment of the present invention, the charge collected on the rotating capacitors that are not selected for charge read out is discarded by short-circuiting them (to electrical ground) when they are not in use. The discarding of the charge on the unselected rotating capacitors results in what is known as decimation, a reduction in the total number of samples used to represent a signal. In the example displayed in FIG. 4*a*, there are five rotating capacitors and only one rotating capacitor is read out, therefore, the decimation is equal to five since only one out of every five samples is used and the remaining four samples are discarded. Decimation is known to cause aliasing and compensation for the aliasing must be provided. Aliasing is a phenomenon that occurs when frequency components of a signal that are located at frequencies greater than the sampling frequency are wrapped around and added to frequency components that are less than the sampling frequency. Aliasing is considered well understood by those of ordinary skill in the art of the present invention and will not be discussed in detail in these specifications.

Additional banks of rotating capacitors can be added to the mixer as an alternative to simply adding rotating capacitors to reduce timing constraints on the charge read out. By simply adding rotating capacitors to an existing current-mode sampling mixer, as displayed in FIG. 4*a*, the samples are decimated by an increasingly larger amount. When there are M rotating capacitors and there are no capacitor banks, the decimation of the discrete-time sample stream is equal to M. The greater the decimation of the sample stream, the greater the amount of aliasing that occurs. Therefore, it is preferred to minimize undesired decimation of the sample stream.

Figure 5B:
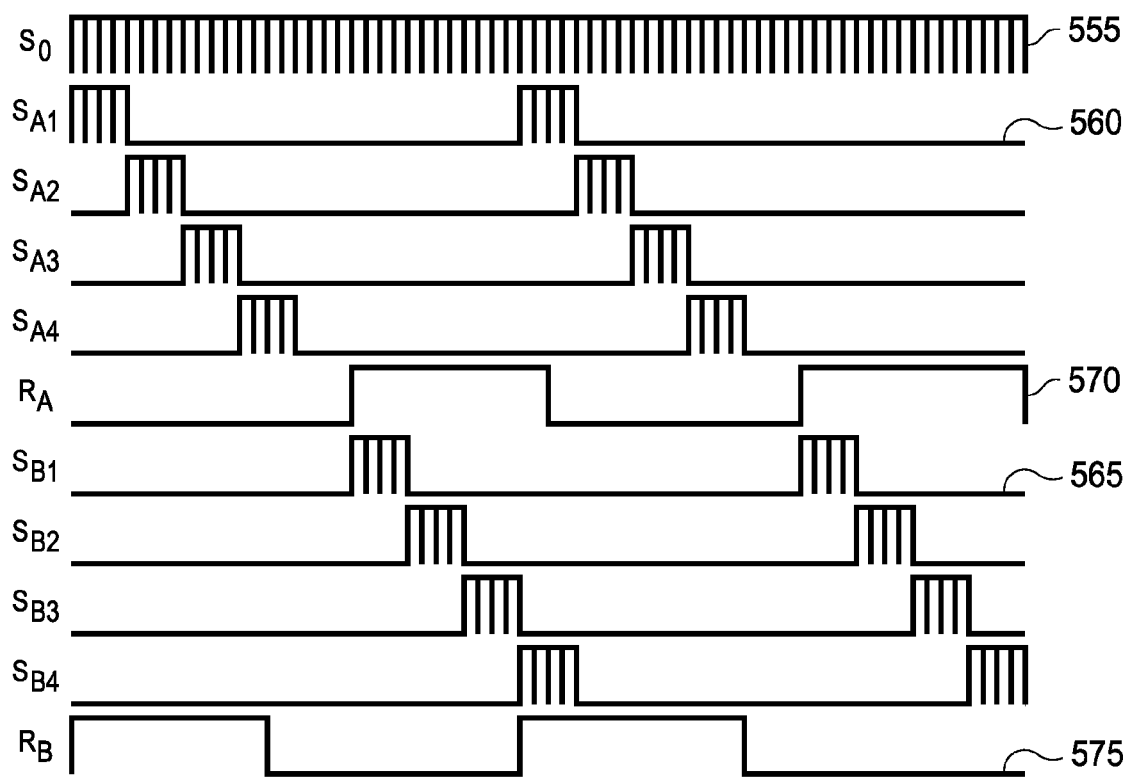
FIGS. 5a and 5b illustrate the use and timing of two banks of rotating capacitors in a current-mode sampling mixer to simultaneously reduce the aliasing of the discrete-time sample stream and relax the charge read out time according to a preferred embodiment of the present invention.
Figure 5A:
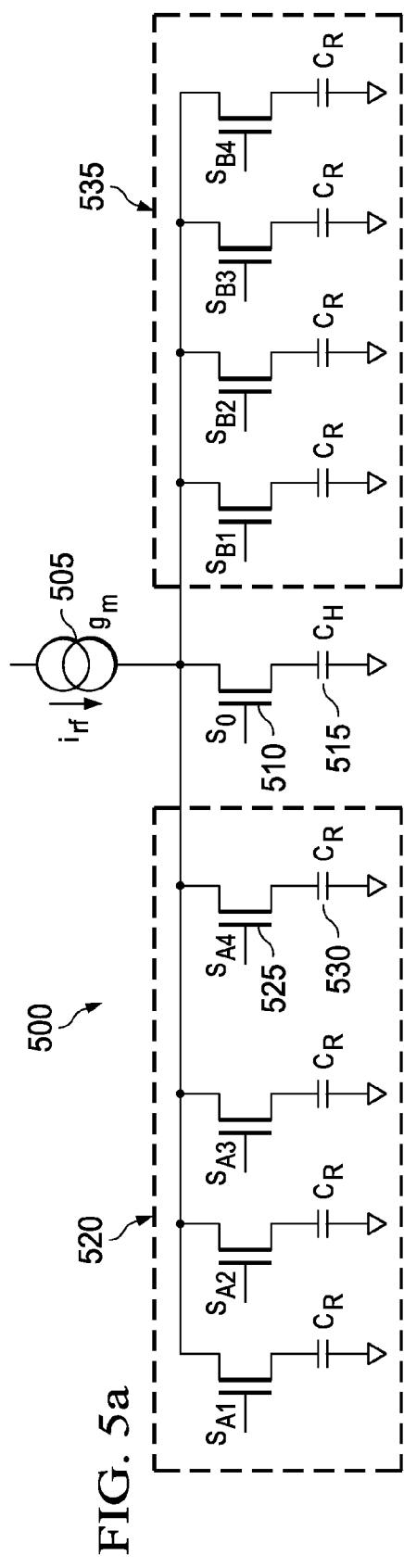

Referring now to FIG. 5*a*, a block diagram illustrates a current-mode sampling mixer 500 utilizing two banks of rotating capacitors 520 and 535 to simultaneously reduce the aliasing of the discrete-time sample stream and relax the charge read out time according to a preferred embodiment of the present invention. The mixer 500 has an RF switch 510, S0, and a history capacitor 515 like the mixer displayed in FIG. 4*a*. According to a preferred embodiment of the present invention, at any given time, one of the rotating capacitor banks 520 or 535 is integrating the RF current with one of its rotating capacitors, for example, rotating capacitor 530, while the remaining rotating capacitors are waiting their turn at integrating the RF current. While one rotating capacitor bank is busy integrating the RF current, the other rotating capacitor bank is having the charge on its rotating capacitors simultaneously read out. Note that it is possible to read out the charge on a subset of the total number of rotating capacitors within a rotating capacitor bank, wherein the subset can be a number smaller than or equal to the total number of rotating capacitors within the rotating capacitor bank.

Referring now to FIG. 5*b*, a timing diagram illustrates the signals driving the various RF switches in the mixer 500 and a charge read out cycle for each of the two rotating capacitor banks according to a preferred embodiment of the present invention. A first timing curve 555 displays the signal output of the LO that is used to drive the RF switch S0. A second timing curve 560 displays the signal used to drive the RF switch SA1 of the rotating capacitor bank 520 while another timing curve 565 displays the signal used to drive the RF switch SB1 of the rotating capacitor bank 535. Other timing curves display the signals used to drive other RF switches in the mixer 500. A timing curve 570 displays the total charge read out cycle for rotating capacitor bank 520 and another timing curve 575 displays the total charge read out cycle for rotating capacitor bank 535.

Taking a closer examination of the timing curve 570, which displays the total charge read out cycle for rotating capacitor bank 520, it is readily evident that the charge read out cycle is active (signified by a high value) only when the rotating capacitors themselves are not integrating the RF current. This permits the charge on all of the rotating capacitors to be read out. According to a preferred embodiment of the present invention, the charge on each of the rotating capacitors within a single rotating capacitor bank is read out by combining the individual charges together (short circuiting the rotating capacitors together) and then reading the combined charge. This results in an FIR filtering operation with a moving average of length equal to the number of rotating capacitors in the rotating capacitor bank. As displayed in FIG. 5*a*, the moving average is four (MA-4). Once the charge stored on the rotating capacitors are read out, the rotating capacitors may be optionally reset. Following the optional reset operation, the rotating capacitors may also have a bias voltage be developed on them.

Figure 6A:
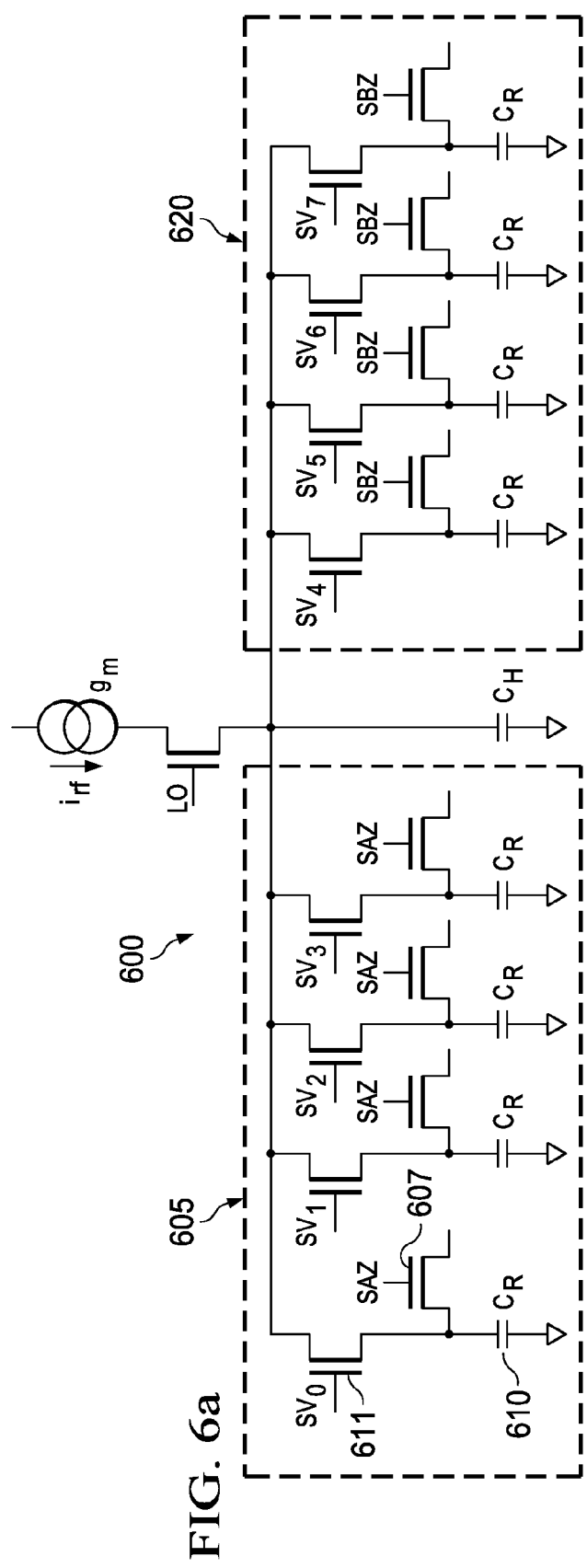
FIGS. 6a-c illustrate the use and timing of two current-mode sampling mixers, each with two banks of rotating capacitors with separate RF switches according to a preferred embodiment of the present invention.
Figure 6B:
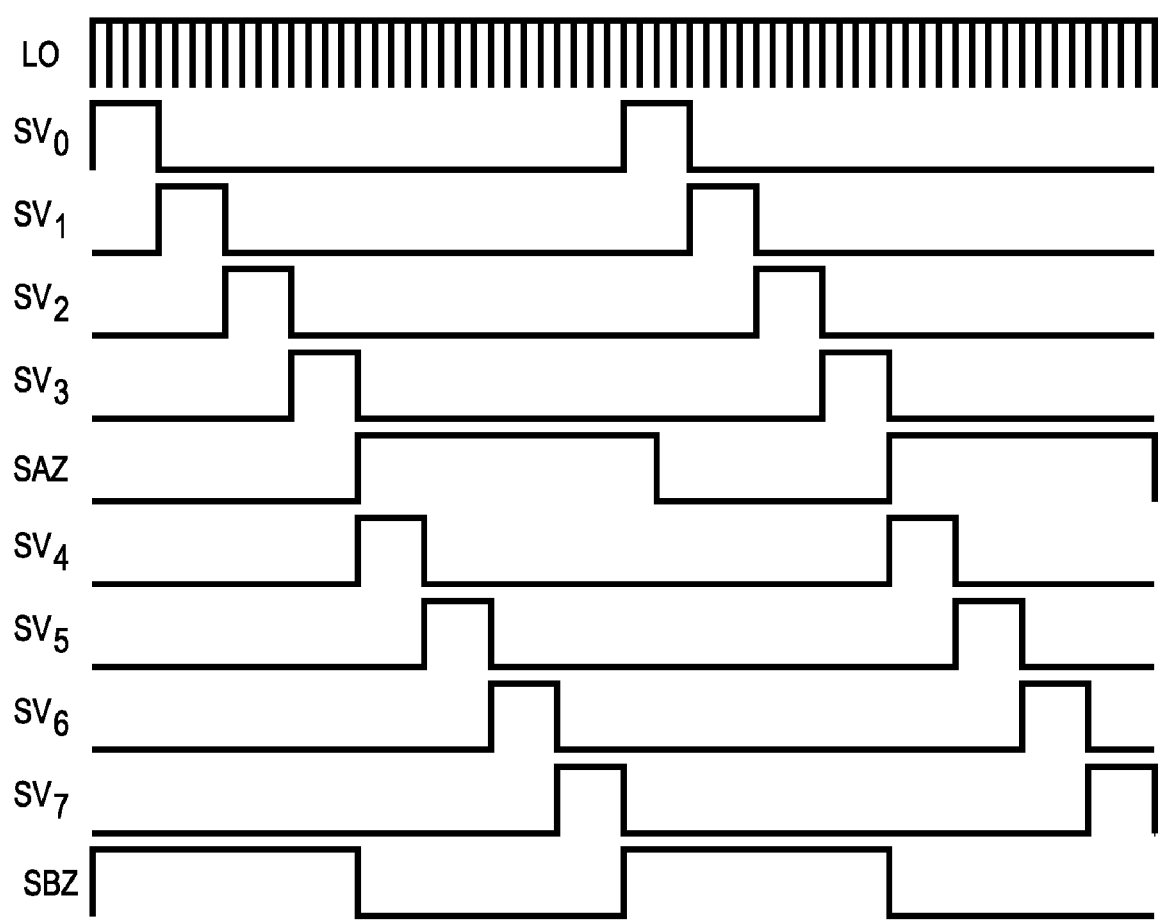

Referring now to FIG. 6*a*, a block diagram illustrates a current-mode sampling mixer 600 with two banks of rotating capacitors 605 and 620 and a separate RF switch according to a preferred embodiment of the present invention. Each rotating capacitor, for example, capacitor 610, is flanked by a switch 607, which is controlled by a charge read out signal. When the charge read out signal is active, the charge on the rotating capacitor can be read through the switch 607. Flanking the charge read out switch is another switch 611. This switch 611 is controlled by a signal that activates and deactivates the rotating capacitor for integrating of the RF current. FIG. 6*b* illustrates the timing of the signals controlling the operation of the mixer 600.

Figure 6C:
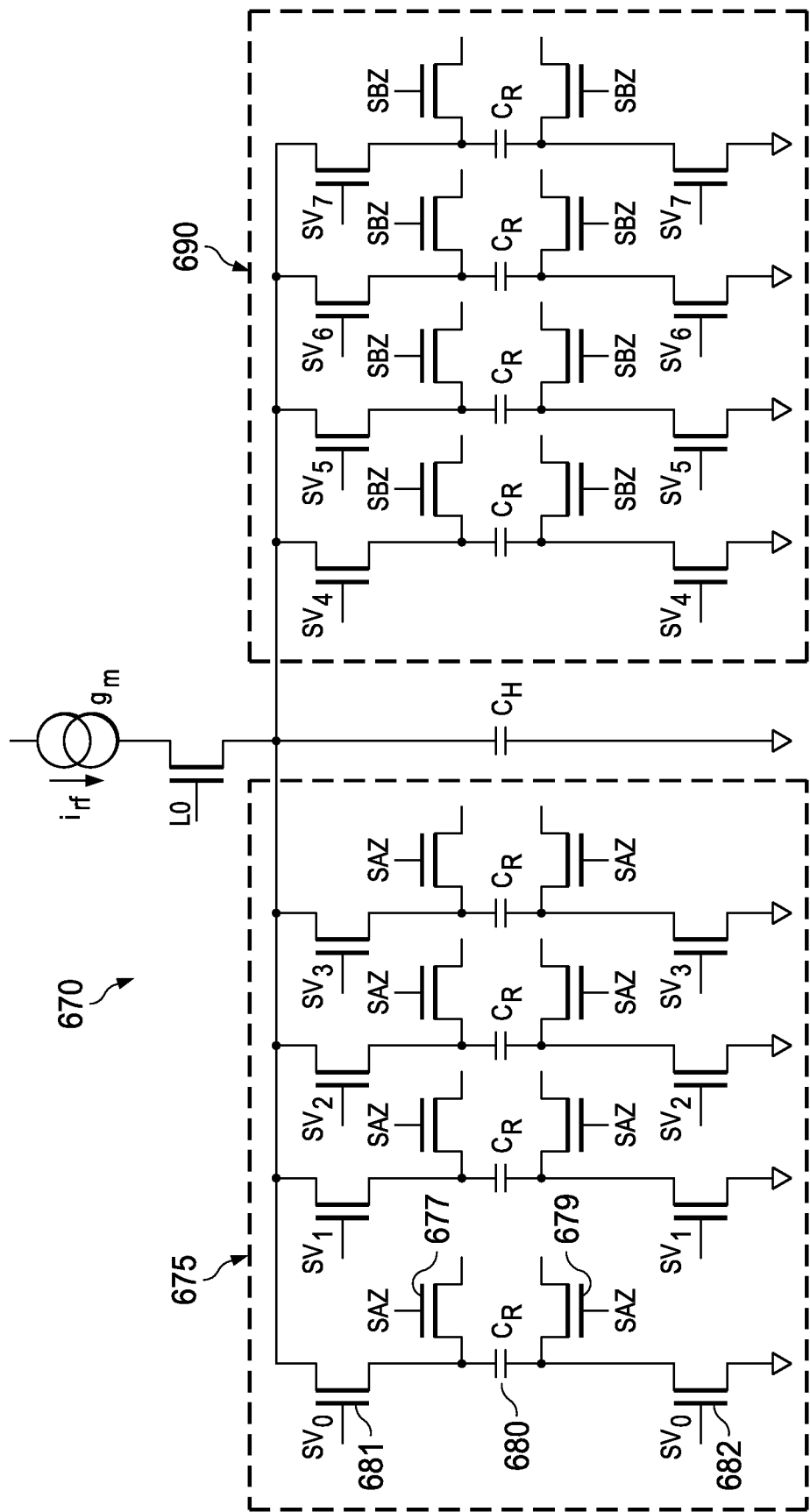

Referring now to FIG. 6*c*, a block diagram illustrates a current-mode sampling mixer 670 with two banks of rotating capacitors 675 and 690 and a separate RF switch according to a preferred embodiment of the present invention. The mixer 670 is essentially the same as the mixer 600 displayed in FIG. 6*a*, with the exception that a rotating capacitor, for example, rotating capacitor 680, is flanked by two switches 677 and 679 that are used to control the charge read out and two other switches 681 and 682 control the integration of the RF current by the rotating capacitor. A useful feature of this particular embodiment is that the charge read out can occur without requiring a coupling to electrical ground. This may be advantageous in a situation such as when the read out charge is coupled to a feedback path of an operational amplifier.

Figure 7A:
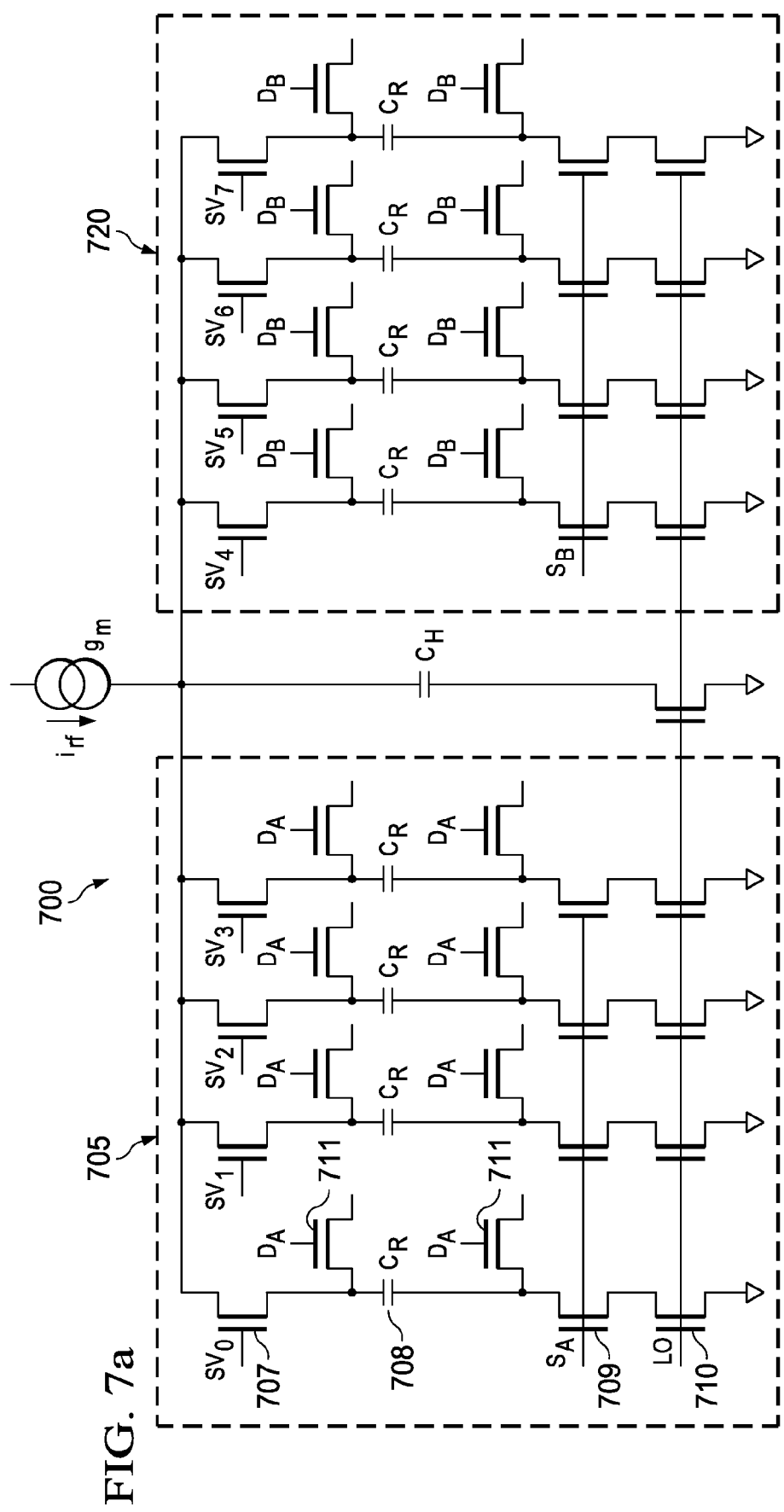
FIGS. 7a and 7b illustrate the use and timing of a current-mode sampling mixer with two banks of rotating capacitors arranged to make use of the bottom-plate sampling technique according to a preferred embodiment of the present invention.
Figure 7B:
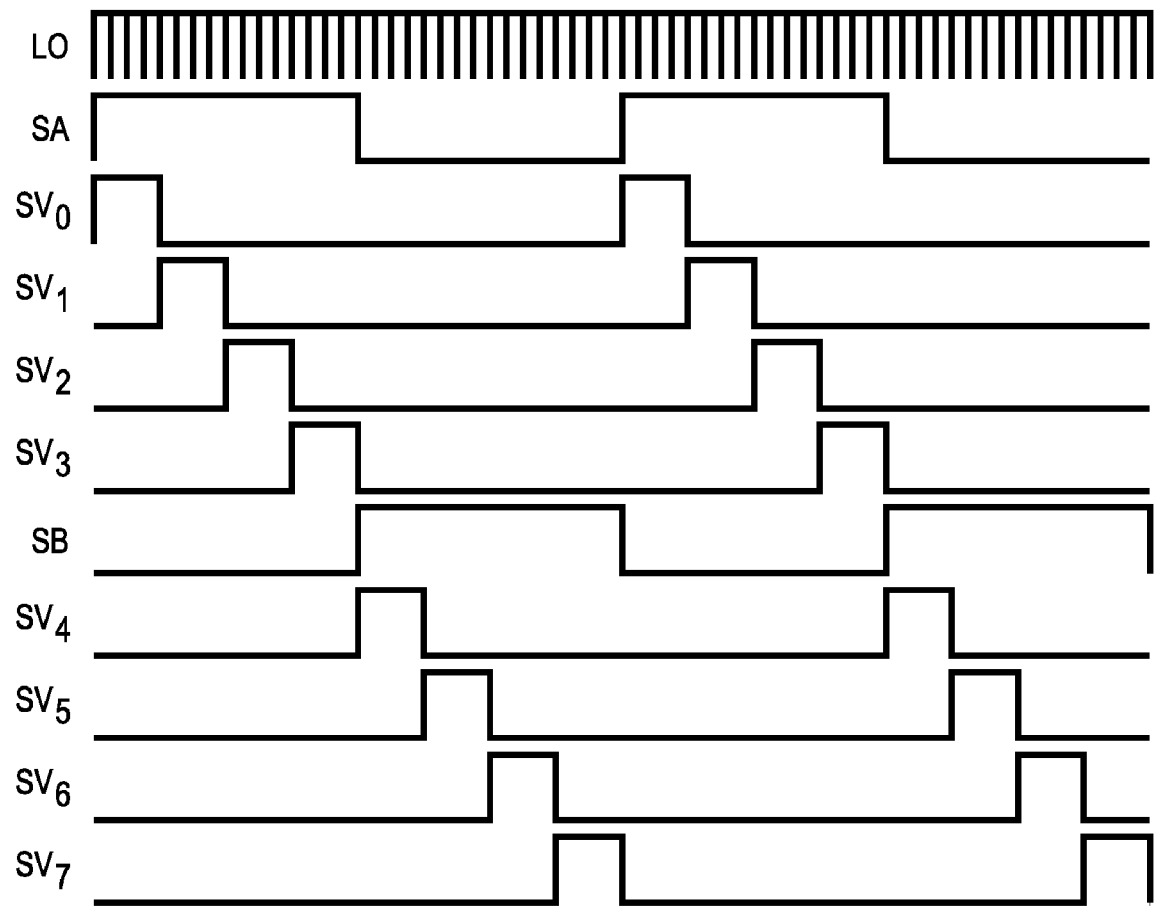

Referring now to FIG. 7*a*, a block diagram illustrates a current-mode sampling mixer 700 with two banks of rotating capacitors 705 and 720 arranged to make use of a bottom-plate sampling technique according to a preferred embodiment of the present invention. The bottom-plate sampling technique is a widely known and used technique in the field of switched capacitor circuits. The use of bottom plate switching offers an advantage in reducing the clock feedthrough and charge injection into the system. Each rotating capacitor, for example, capacitor 708, is coupled to electrical ground by a pair of switches. A first switch 709 is controlled by a sampling control signal and a first RF switch 710 is controlled by a signal generated by the LO. According to a preferred embodiment of the present invention, when both the sampling signal and the LO signal are high, then the rotating capacitor 708 may integrate the RF current if its sampling control signal is also active. A second switch 707 is controlled by the sampling control signal. An additional switch pair (displayed as two switches labeled 711) is used to permit the charge read out. FIG. 7b illustrates the timing of the signals controlling the operation of the mixer 700.

Due to differences between the impedance of the mixer and desired output impedance, an active buffer is required to isolate the mixer from the output. Typically, the mixer has a high impedance while it is desired that the output has a low driving impedance. The active buffer can also be used to realize a second, lower-rate IIR filtering operation through the use of passive charge sharing.

Figure 8:
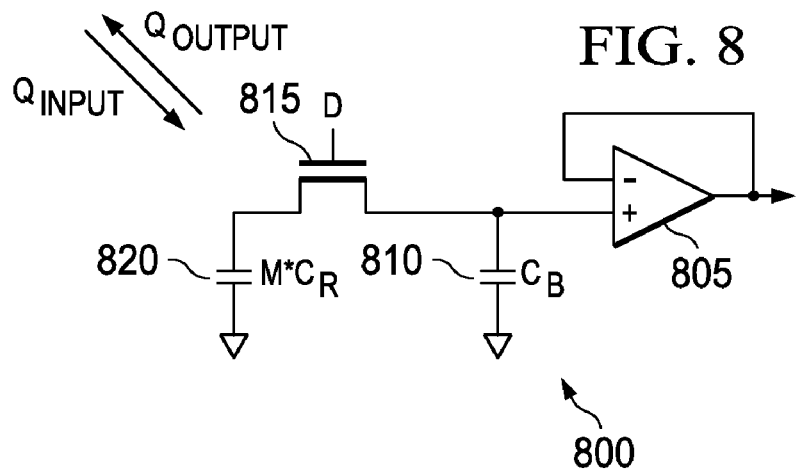
FIG. 8 illustrates an active buffer used to realize a second infinite-impulse response filter stage according to a preferred embodiment of the present invention.

Referring now to FIG. 8, a diagram illustrates the use of an active buffer 805 to realize a second IIR filtering stage 800 according to a preferred embodiment of the present invention. The buffer 805 actually does not play an active role in the IIR filtering operation. Rather, it is used to sense voltage from a buffer capacitor 810, $C_B$, and to present it to the output with a low driving impedance. An RF switch 815 couples the rotating capacitors 820 (displayed here as a single capacitor of value $M^*C_R$) to the buffer capacitor 810 during the charge read out phase. As discussed previously, M is the number of rotating capacitors in a single capacitor bank, and in this example, M=4. At the end of the charge read out phase, the switch 815 opens, disconnecting the rotating capacitors 820 from the capacitor 810. After being disconnected, the rotating capacitors 820 have their charge reset. It is the resetting of the charge stored on the rotating capacitors that gives rise to the IIR filtering operation. According to a preferred embodiment of the present invention, the IIR filtering operation is referred to as an IIR-2 filtering operation.

Figure 9:
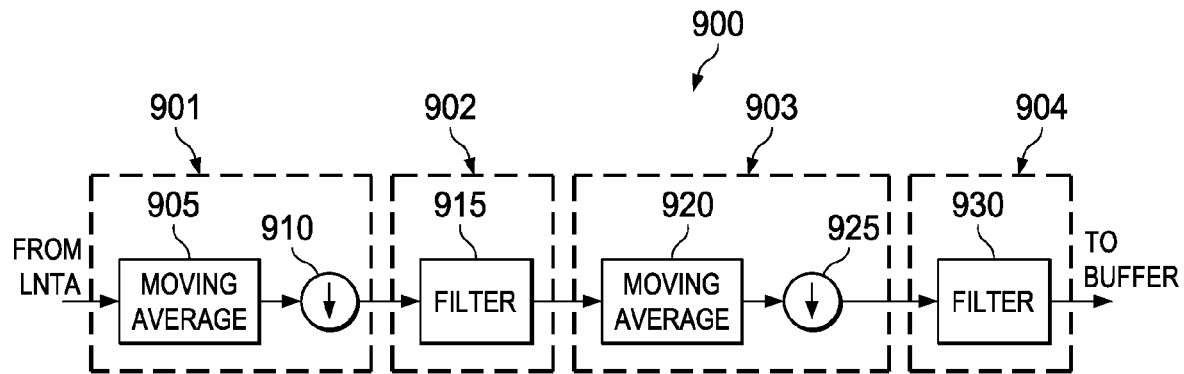
FIG. 9 illustrates the signal processing performed by a current-mode sampling mixer according to a preferred embodiment of the present invention.

Referring now to FIG. 9, a block diagram illustrates a current-mode sampling mixer 900 grouped by the signal processing steps that it performs according to a preferred embodiment of the present invention. According to a preferred embodiment of the present invention, the signal processing performed by the mixer can be logically viewed as four distinct FIR/IIR filtering operations. A first FIR filtering operation 901 arising from a combination of a moving average operation 905 and a decimation operation 910 resulting from the configuration of the rotating capacitors (such as one displayed in FIG. 3a). The moving average and decimation operations are the result of the integrating of N consecutive cycles of the RF current by a single rotating capacitor. A second filtering operation 902 is an IIR filtering operation (displayed in FIG. 9 as a filter 915) and referred to as an IIR-1 operation. The IIR-1 filtering operation arises from the presence of the history capacitor and the continuous integration of the RF current by the history capacitor and its use in conjunction with the rotating capacitors. The filtering operation 915 is determined by the ratio of the history capacitor, $C_H$, to the value of the rotating capacitors, $C_R$. The IIR-1 filtering operation has a Z-domain pole located at $a_1$, where $a_1$ is a number smaller than 1.

A third filtering operation 903 is a second FIR filtering operation that is a combination of a second moving average operation 920 and a second decimation operation 925. These two operations result from the configuration and arrangement of the rotating capacitors along with the operation of electrically coupling the rotating capacitors together. According to a preferred embodiment of the present invention, not all rotating capacitors are electrically coupled together. A subset of the total number of rotating capacitors is electrically coupled together, and the active rotating capacitor is not electrically coupled with other rotating capacitors. The second moving average and decimation operations 920 and 925 are directly dependent of the number of rotating capacitors in a rotating capacitor bank. According to a preferred embodiment of the present invention, the number of capacitors in a rotating capacitor bank is four. Therefore, the moving average operation 920 is a moving average of four and the decimation operation 925 is a decimation by four. Finally, a fourth filtering operation 904, an IIR filtering operation referred to as an IIR-2 operation, also arises from the configuration of the rotating and buffer capacitors. The IIR-2 operation is achieved at the end of the charge dump phase, when the rotating capacitors 820 are disconnected from the buffer capacitor 810 and any remaining charge on the rotating capacitors 820 are reset prior to returning to actively integrating the RF current. It is the resetting of the charge that gives rise to the IIR-2 operation. The filtering operation 930 has a Z-domain pole located at $a_2$, where $a_2$ is defined as $C_B/(C_B+M^*C_R)$, where $C_B$ is the value of the buffer capacitor (810, FIG. 8) and $M^*C_R$ is the number of capacitors in a rotating capacitor bank (M) multiplied by the value of a rotating capacitor ($C_R$). The behavior is expressible in equation form:

$$z_k = a_2(z_{k-1} + y_k) = a_2 z_{k-1} + a_2 y_k$$

where: $y_k$ is the input charge, $z_k$ is the charge stored on the buffer capacitor $C_B$ 810 at sampling time k.

As discussed previously, a bias voltage may be placed onto the rotating capacitors after the rotating capacitors have had their accumulated charges read out and optionally, reset. For example, the bias voltage on the rotating capacitors may be set to a specified value to prevent accumulated charge on the history capacitor from exceeding a maximum (or minimum) amount of charge that the capacitor can hold. A saturation of the charge holding capability of the history capacitor is a concern since it is constantly integrating the RF current, while each of the rotating capacitors is reset after integrating the RF current for N RF cycles. One way to accomplish the setting of a bias voltage onto the rotating capacitors is through the use of a feedback correction loop, wherein a feedback current is integrated by a feedback capacitor, which in turn shares its charge with the rotating capacitors.

Figure 10:
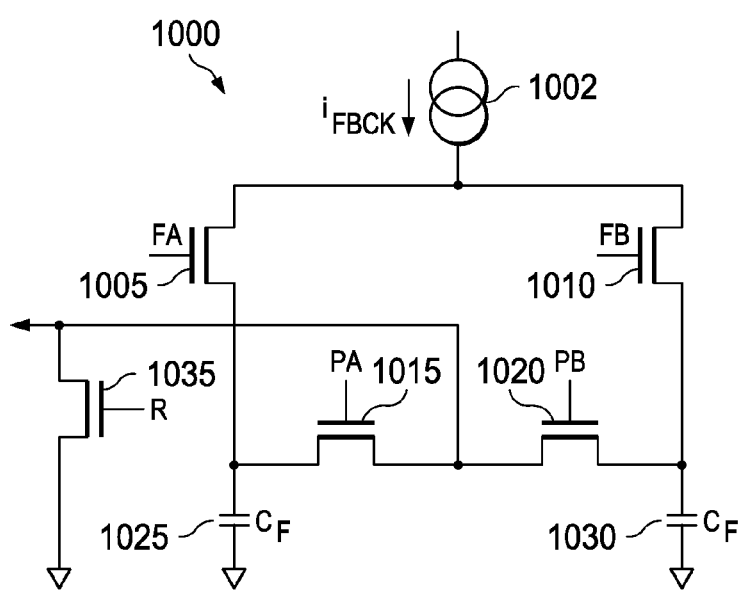
FIG. 10 illustrates a feedback charge accumulation structure used to establish a bias voltage (by periodically initializing a charge) on the rotating capacitors according to a preferred embodiment of the present invention.

Referring now to FIG. 10, a block diagram illustrates a feedback charge accumulation structure 1000 used to initialize the charge on rotating capacitors according to a preferred embodiment of the present invention. An amplifier 1002, with a gain of $g_m$ (which, according to a preferred embodiment of the present invention, may be realized as a current-mode digital-to-analog converter (DAC)), produces a desired feedback current, $i_{FBCK}$, and when either switch FA 1005 or FB 1010 is closed, the feedback current is integrated by one of two feedback capacitors, $C_F$, 1025 or 1030. The charge stored on the feedback capacitor is shared with the rotating capacitors (not shown) when either switch PA 1015 or PB 1020 is closed. Another switch 1035, R, shunts the charge to ground, resetting the charge on the rotating capacitors, prior to the precharging operation. The timing of the switches will be discussed below.

It is advantageous to utilize the feedback charge accumulation structure (FIG. 10) to create a higher-level correction loop. In addition to the current-mode sampling mixer, the higher-level correction loop can involve an analog-to-digital converter (ADC) or quantizer, digital filtering and other digital signal processing functions, such as sigma-delta conversion. Generically, the term quantizer is often used to refer to either a quantizer, which is commonly acknowledged as being primitive, and an ADC, which commonly has other functional units such as filtering. Examples of possible uses of the higher-level correction loop include: removing close-in interferers and linearizing the current-mode sampling mixer. To remove close-in interferers, output of the ADC can be digitally processed to detect the interferers and appropriately phase shifted and scaled samples can be used to constructively remove the interferers. Linearizing the current-mode sampling mixer involves the digital processing of the output of the ADC so that appropriately phase-shifted and scaled samples injected into the mixer would linearize the datapath.

Figure 11A:
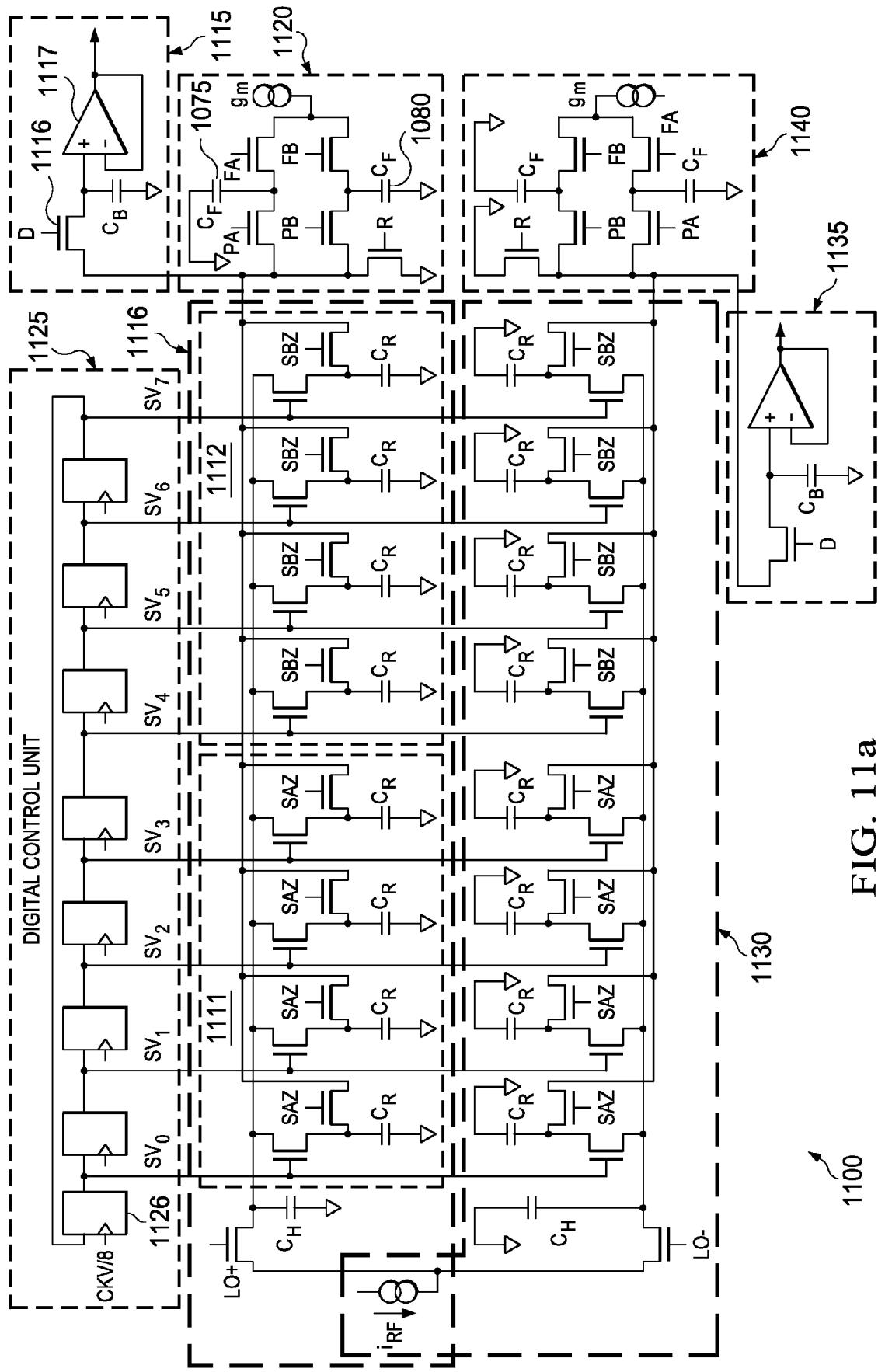
FIGS. 11a and 11b illustrate a physical implementation of a portion of a current-mode sampling mixer along with a detailed view of a portion of a clock generating circuit according to a preferred embodiment of the present invention.

Referring now to FIG. 11a, a block diagram illustrates a physical implementation of a portion of a current-mode sampling mixer 1100 according to a preferred embodiment of the present invention. According to a preferred embodiment of the present invention, the mixer 1100 processes both the in-phase (I) and quadrature-phase (Q) sampled versions of the received signal and operates in differential signaling mode, i.e., each of the signal streams is represented by a positive and a negative stream. Therefore, the mixer 1100 processes the I+, I−, Q+, and Q− signals. FIG. 11a displays the I (both I+ and I−) signal path portion of the mixer, although the Q signal path of the mixer is similar. While the use of the in-phase and quadrature-phase signal paths imply the presence of orthogonal signal bases, the present invention can make use of non-orthogonal signal bases as well.

The I signal path of the mixer 1100 includes a I+ sampling structure 1110, an I+ second IIR filter 1115, an I+ feedback charge accumulation structure 1120, a digital control unit (DCU) 1125, an I− sampling structure 1130, an I− second IIR filter 1135, and an I− feedback charge accumulation structure 1140. The I+ sampling structure 1110 (and I− sampling structure 1130) is as described in FIG. 6a. The I+ second IIR filter 1115 (and I− second IIR filter 1135) is as described in FIG. 8 and the I+ feedback charge accumulation structure 1120 (and I− feedback charge accumulation structure 1140) is as described in FIG. 10.

According to a preferred embodiment of the present invention, the DCU 1125 is used to generate signals to activate and deactivate rotating capacitors, along with other signals used to control the operation of the mixer 1100. Note that hardware used to generate the other signals is not displayed in FIG. 11a. The generation of the signals used to activate and deactivate the rotating capacitors is implemented using a shift-register, with the number of registers being equal to the total number of rotating capacitors per signal path. For example, there are two banks of four rotating capacitors per signal path for a total of eight rotating capacitors and therefore, there are eight registers in the shift-register. Each register in the shift-register is driven by a clock that is equal to the period of the LO divided by eight, since N=8 (decimation value). Again, should a different value of N be used, the division of the LO signal would necessarily be different.

According to a preferred embodiment of the present invention, a circular shift register with a rotating bubble is used. The bubble shift register is different from a normal circular shift register in that the contents of all but one register contains the same value, while the one register contains a different value, i.e., the bubble. The bubble shift register is initialized into the following state: a one value is stored in one of the registers (for example, register 1126) and the remaining registers store a zero value. Then, each time the registers in the shift register are clocked (once every eight cycles of the LO), the one value moves from its current register to the register adjacent to it. Note that the registers are connected in a circular fashion so that the output of the last register in the shift register rolls around and becomes the input of the first register in the shift register.

Figure 11B:
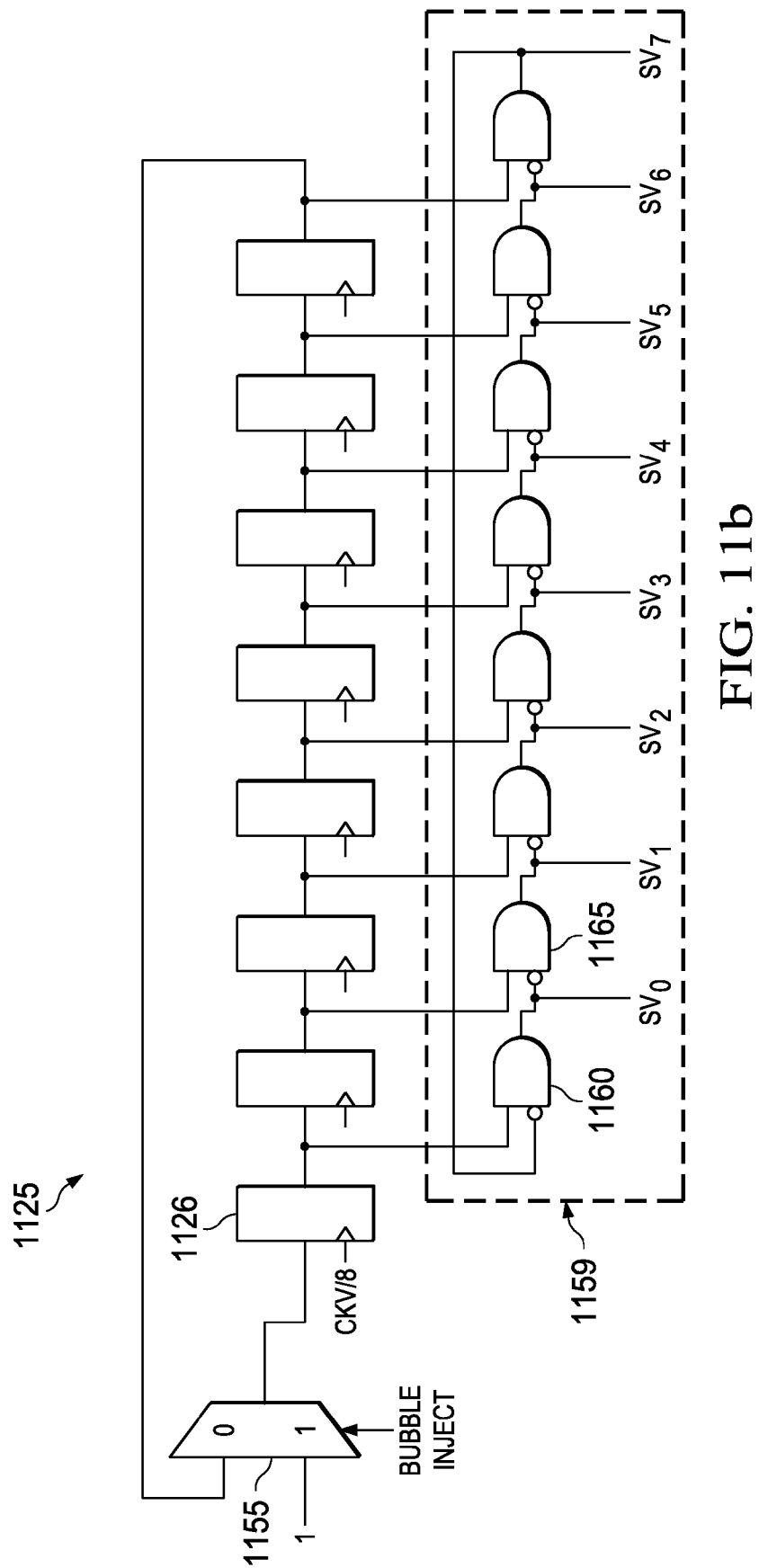

Referring now to FIG. 11b, a block diagram presents a detailed view of the bubble shift register according to a preferred embodiment of the present invention. FIG. 11b presents a view of the bubble shift register in greater detail along with a non-overlap circuit, which will be discussed below. The bubble shift register includes a sequential string of registers, like a normal circular shift register and a multiplexer 1155. The multiplexer 1155 allows control circuitry (not shown) to select the input into one of the registers in the shift register chain. For example, the signal driving the input of register 1126 can either be the output of the register immediately before it or a binary one value. The multiplexer 1155 is controlled by a bubble inject line. If the bubble inject line selects the output of the previous register (bubble inject line equals zero (0)), then the bubble shift register operates in a manner similar to a normal circular shift register. If the bubble inject line selects the binary one value (bubble inject line equals one (1)), then the binary one value becomes the input into the register 1126. This loads the one value into the bubble shift register. According to a preferred embodiment of the present invention, the bubble shift register initializes into a zero state where all of the registers in the bubble shift register is cleared. Then, the binary one is loaded into one of the registers of the bubble shift register and normal operation can commence. It is preferred that the bubble shift register be loaded only one time.

The use of shift registers is an efficient way of generating the signals required to control the activation (and deactivation) of the rotating capacitors. For example, through the use of the bubble shift register, the power consumed is reduced due to a reduction in the total number of signal transitions. This is because each time the bubble shift register is clocked, there are only two signal transitions. Additionally, by using only bubble shift registers to generate the signals, the signal generating hardware is greatly reduced (when compared to a complex array of combinatorial logic), hence there is a reduction in both hardware design complexity and power consumption.

Whichever register contains the one value produces a control signal that is high, while the remaining signals produced by the bubble shift register is low. The rotating capacitor associated with the register producing the control signal with the high value is active and is used to integrate the RF current. After a certain number of RF clock cycles, for example, eight RF clock cycles, the bubble shift-register is clocked and the one value moves to the next register in the shift register and the rotating capacitor that was formerly active becomes inactive and the rotating capacitor associated with the next register becomes active.

Since the bubble shift register in the DCU 1125 is a synchronous device, each time that the bubble shift register is clocked (for example, once every eight RF cycles), the contents of the registers immediately changes. Because of the immediate change in the value of the various control signal lines, a situation may arise when more than one rotating capacitor is active at one time. This is not desired because it can result in the integrating of the RF current on two different rotating capacitors. To remedy this situation, a non-overlap circuit 1159 is needed.

The non-overlap circuit 1159 is a combinatorial circuit used to insert a gate transition delay between the time when a first control signal changes state (for example, transitioning from high to low) and a second changes state (for example, transitioning from low to high) as a result of the first control signal. The non-overlap circuit 1159 is made up of a linear sequence of two-input AND logic gates arranged in a circular fashion, similar to the circular shift register discussed above. The output of one AND gate becomes a first input of the AND gate immediately following it. According to a preferred embodiment of the present invention, the first input is an inverted input. The second input (non-inverting) of the AND gate is the output of one of the registers in the bubble shift register.

The operation of the non-overlap circuit 1159 is as follows. Assuming that upon initialization or reset, the contents of registers in the bubble shift register are all zero. This places a zero at the second input of each of the AND gates in the non-overlapping circuit 1159, therefore, the outputs of all AND gates is zero. With the outputs of all AND gates equal to zero, a one is placed at the first input of each AND gate, due to the inverting nature of the first input. Once the bubble inject line changes value to load the one value into a register, for example, register 1126, the second input of the AND gate associated with the register 1126 (for example, AND gate 1160) becomes a one. With both inputs being one, the output of the AND gate becomes a one, changing the control signal $SV_0$ to one.

After N RF cycles (N=8 in this example) have elapsed, the bubble shift register is clocked, moving the bubble from register 1126 to the next register in the shift register. This places a one at the second input of AND gate 1165. With the second input of the AND gate 1160 no longer one, the output of AND gate 1160 becomes a zero, which becomes a one at the first input of AND gate 1165 (due to the inverting nature). The output of AND gate 1165 now becomes a one and the control signal $SV_1$ becomes a one. This process continues as long as the bubble shift register is being clocked.

The non-overlap circuit 1159 inserts a delay equal to one AND gate in between the time when the output of one register changes to when the corresponding control signal changes. It is the propagation delay of the AND gate that causes the non-overlap. Should additional delay be desired, buffers can be added between the outputs and inputs of the AND gates. For example, a couple of inverters will add two inverter delays without changing the values of the signals involved.

Additional control signals may be derived using combinatorial logic based on the output of the bubble shift register. For example, a signal used for activating and deactivating a capacitor bank can be derived by combining the outputs of the registers in the bubble shift register in a multi-input OR logic gate. The signal responsible for activating/deactivating a capacitor bank would combine the outputs of all registers associated with rotating capacitors in the capacitor bank. Therefore, when one of the rotating capacitors in the capacitor bank is to be activated, the entire bank is activated. Similarly, a reset signal can be derived by combining the outputs of the registers associated with rotating capacitors N−1 of the various capacitor banks and a precharge signal can be derived by combining the outputs of the registers associated with rotating capacitors N of the various capacitor banks. For example, if there are two capacitor banks with four rotating capacitors each, then the reset signal would be derived from the logical OR of the register outputs associated with rotating capacitors two and six (assuming the capacitors are numbered zero to three and four to seven) and the precharge signal would be derived from the logical OR of the register outputs associated with rotating capacitors three and seven.

Figure 12:
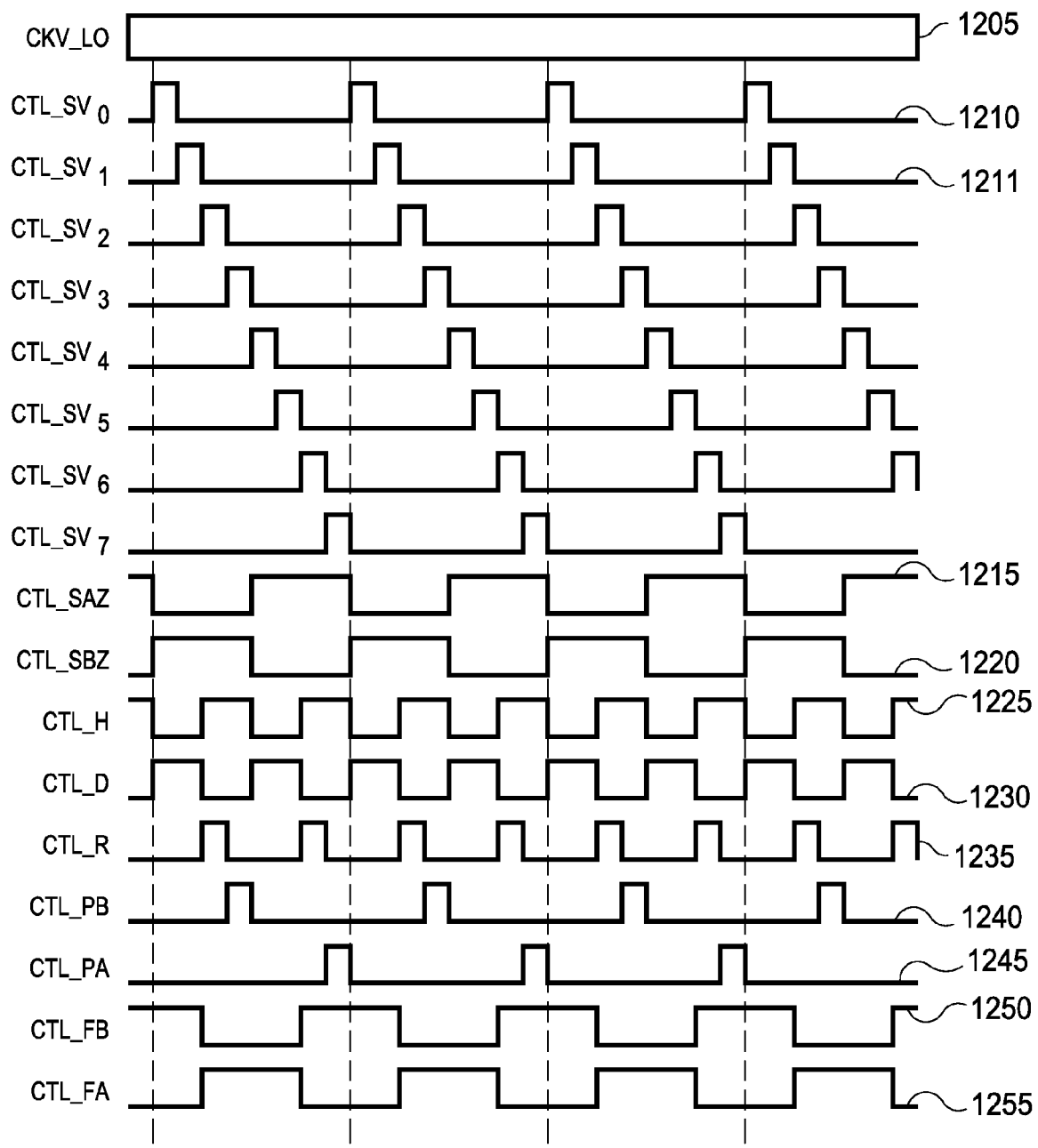
FIG. 12 illustrates the timing between signals used for activating rotating capacitors used in the current-mode sampling mixer of FIG. 11a according to a preferred embodiment of the present invention.

Referring now to FIG. 12, a timing diagram illustrates the relationship between various signals used in the mixer 1100 according to a preferred embodiment of the present invention. A first timing trace 1205 displays a signal generated by a LO. Note that the frequency of the signal is so great that the timing trace 1205 appears to be a solid line. A second timing trace 1210 displays the signal "$SV_0$" used to control a rotating capacitor in rotating capacitor bank 1111 (FIG. 11*a*). The signal "$SV_0$" is also used to control a rotating capacitor in the I− signal path as well as the other two signal paths, Q+ and Q− (neither shown). Other timing traces display the other SV signals for controlling the other rotating capacitors. Notice a pulse on a third timing trace 1211 displaying the signal "$SV_1$" begins a small amount of time after the pulse on the second timing trace 1210 ends. Note that due to display limitations, FIG. 12 displays the traces as if one trace begins immediately after another trace ends when there is actually a small amount of time, preferably one AND gate (as discussed previously), between the end of one pulse and the beginning of another. The delay between pulses on the timing traces is due to the non-overlap circuit 1159 (FIG. 11*b*) discussed above.

A fourth timing trace 1215 displays the "SAZ" signal. The SAZ signal is used to deactivate the rotating capacitor bank A. When the SAZ signal is high, the charge on the rotating capacitors in bank A is read out and various other operations such as a reset, followed by a precharging of the rotating capacitors to a specified value, turning on the feedback charge accumulation structure, etc. A fifth timing trace 1220 displays the "SBZ" signal. The SBZ signal performs the operations associated with the SAZ signal for the rotating capacitor bank B.

A seventh timing trace 1230 displays the "CTL_D" signal used to couple the rotating capacitor bank to the buffer capacitor, $C_B$ (discussed in FIG. 8), allowing the charge from the rotating capacitors to be shared with the buffer capacitor, resulting in the charge on the rotating capacitors appearing on the output of the buffer.

An eighth timing trace 1235 displays the "CTL_R" signal used to couple an inactive rotating capacitor bank (the one that is not currently integrating the RF current) to electrical ground. Of course, since the resetting operation is an optional step, the "CTL_R" signal may not be present. A ninth timing trace 1240 displays the "CTL_PB" signal used to couple a feedback capacitor, $C_F$, to rotating capacitor bank B, while a tenth timing trace 1245 displays the "CTL_PA" signal used to couple a different feedback capacitor, a second $C_F$, to rotating capacitor bank A.

An eleventh timing trace 1250 displays the "CTL_FB" signal used to allow the feedback capacitor, $C_F$, to integrate the feedback current, $i_{FBCK}$, intended for rotating capacitor bank B. A twelfth timing trace 1255 displays the "CTL_FA" signal, performing the same operation as the "CTL_FB" signal except for rotating capacitor bank A.

The four signal paths (I+, I−, Q+, and Q−) in the mixer 1100 correspond to phase differences with respect to the signal generated by the LO. For example, I+ corresponds to a zero (0) degree phase difference with the LO, while I− corresponds to a 180 degree phase difference, and Q+ and Q− are 90 and 270 degrees of phase difference from the LO signal respectively. To generate the different SV signals for activating different rotating capacitors in the different signal paths, it is typical to have a single LO generate a reference signals and then have signal generating hardware to generate the required SV signals for the signal paths.

Figure 13:
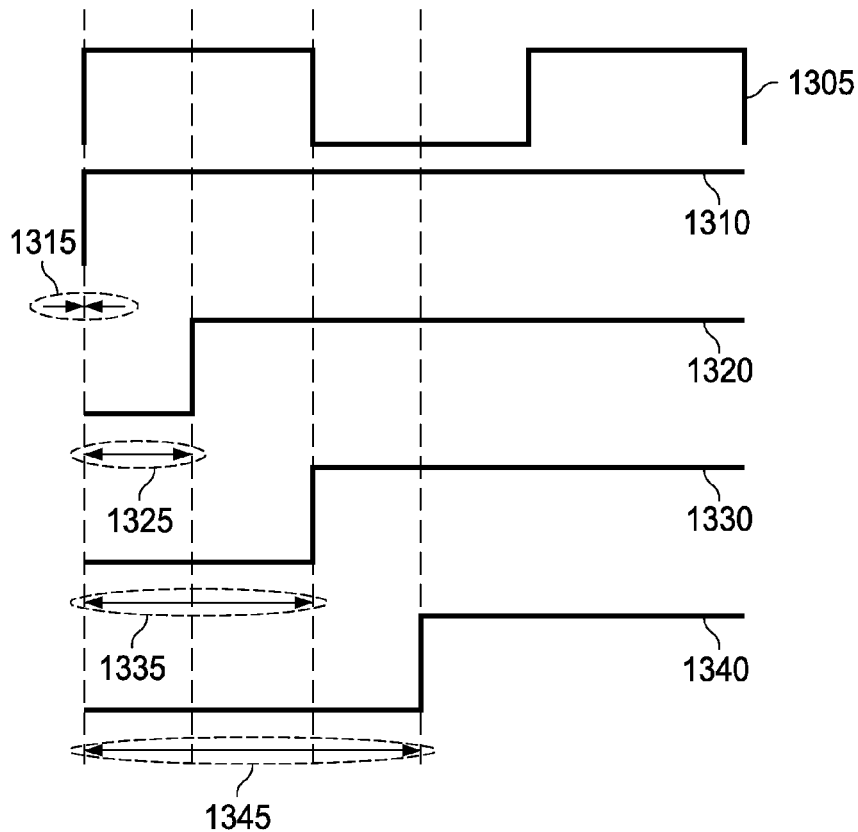

Referring now to FIG. 13, a timing diagram illustrates the ideal phase angle differences between the $SV_0$ signals for each of the four signal paths in the mixer 600. A first timing trace 1305 displays a signal generated by the LO. A second timing trace 1310 displays the SV0 signal for signal path I+.

According to a preferred embodiment of the present invention, the LO used to generate the reference clock signal is also used for the signal path I+. Since the phase difference between the LO and the I+ signal is zero degrees, there is no difference between the start of the SV0 signal and the LO signal (displayed as interval 1315). A third timing trace 1320 displays the SV0 signal for signal path Q+. With a 90 degree phase difference between the Q+ signal and the LO, the difference between the start of the SV0 signal and the LO signal (displayed as interval 1325) is a quarter of the period of a single LO period.

A fourth timing trace 1330 displays the SV0 signal for signal path I−. Since the phase difference between the LO and the I− signal is 180 degrees, there is a half LO period difference between the start of the SV0 signal and the LO signal (displayed as interval 1335). A fifth timing trace 1340 displays the SV0 signal for signal path Q−. With a 270 degree phase difference between the Q− signal and the LO, the difference between the start of the SV0 signal and the LO signal (displayed as interval 1345) is three quarters of a LO period.

However, there is a large amount of hardware required to accurately generate the SV signals for the four different signal paths. When considering one of the major applications of the current-mode sampling mixer 1100 is in portable wireless communications devices, power consumption is of the utmost importance. Any reduction in power consumption is desirable because it increases battery life.

Taking into account the capacitance of the history capacitor, $C_H$, when compared to the capacitance of the individual rotating capacitor, $C_R$, where $C_H = a_1 * C_S$ and $C_R = (1-a_1) * C_S$ with $a_1$ being a number less than one. According to a preferred embodiment of the present invention, $a_1 = 0.9686$, therefore, if $C_S = 15.925$ pF, then $C_R = 0.5$ pF and $C_H = 15.425$ pF. With the capacitance of $C_H$ being significantly larger than the capacitance of $C_R$, the majority of the RF current integrated by the two capacitors will be stored by the history capacitor, $C_H$, and not the rotating capacitor, $C_R$. Because of the fact that a very small charge is actually stored on the $C_R$ capacitors, a slight misalignment in the timing of the activate and deactivate signals for the rotating capacitors will not result in a significant degradation in performance, as long as the amount of time that each rotating capacitor spends integrating the RF current remains consistent. Taking advantage of the large difference between $C_H$ and $C_R$ and the superposition principle, a single LO can be used to generate all of the SV signals for all signal paths in the mixer.

For example, the signal from an LO generating signals with a zero degree phase difference would produce SV signals with no phase errors with the SV signals in the I+ signal path. The same SV signals would have a 180-degree phase deviation with the SV signals in the I− signal path. However, since the SV signals are eight LO periods long (according to a preferred embodiment of the present invention), the 180-degree phase deviation turns out to be a 6.25% deviance for the activate/deactivate signal. For the Q+ signal path, the same SV signals would have a 90-degree phase deviation (or 3.125% deviance) and for the Q− signal path, the 270-degree phase deviation would result in a 9.375% deviance.

While there exists a phase deviation, the duration of the periods of the SV signals remain accurate. It is the combination of the small size of the rotating capacitor (preferably less than 4% the size of the history capacitor) and the maintained accuracy in the duration of the SV periods that yields essentially the same results as if four different and independent clock generators were used to generate the SV signals for each of the four signal paths.

Figure 14:
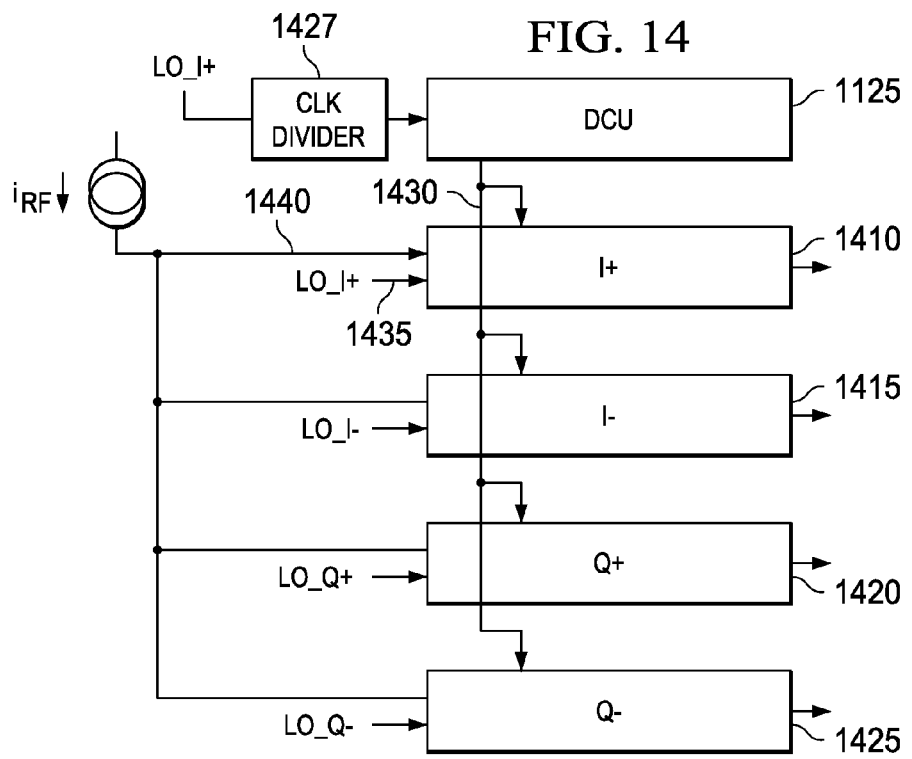
FIG. 14 illustrates a current-mode sampling mixer utilizing a local oscillator to derive a complete set of control signals for activating and deactivating rotating capacitors according to a preferred embodiment of the present invention.

Referring now to FIG. 14, a block diagram illustrates a current-mode sampling mixer utilizing a single LO to generate a complete set of signals for activating rotating capacitors according to a preferred embodiment of the present invention. The signals for activating the rotating capacitors and controlling the operation of the signal paths are generated in the DCU 1125. The DCU 1125 uses the divided signal from a single LO to generate its signals. The preferred signal is the signal of the I+ signal path since is in zero (0) degrees out of phase with the reference LO of the radio transceiver and the received RF data, however, the LOs from the other signal paths are equally usable with no needed adjustments for the phase angle deviation.

A clock divider 1427 divides the clock signal from the LO and provides the divided clock signal to the DCU 1125. Alternatively, the DCU 1125 contains its own clock divider circuitry and the signal produced by the LO is provided directly to the DCU 1125. According to a preferred embodiment of the present invention, the clock divider 1427 divides the signal provided by the LO by a factor of eight. This means that the clock divider 1427 will generate a single clock edge for every eight LO clock edges that it receives.

As discussed previously, the DCU 1125 uses a circular shift register to generate the activate and deactivate signals for the rotating capacitors. The signals generated by the DCU 1125 are provided to the individual signal paths I+ 1410, I− 1415, Q+ 1420, and Q− 1425 by a series of connections (displayed in FIG. 14 as a single connection 1430). The line 1430 provides the same set of signals to each of the four signal paths.

Each signal path is connected to a properly phased signal from the LO. For example, the I+ signal path 1410 is connected to the LO_I+ output of the LO. As discussed previously, the phase angle deviation presented to three of the four signal paths does not produce a measurable difference in the performance of the current-mode sampling mixer. Also coupled to the different signal paths is a transconductance amplifier that provides the RF current to the signal paths. The RF current is integrated in the signal paths, which produces discrete-time sample streams based on the integrated current. Each signal path provides an output in the form of a stream of discrete-time samples that are processed by the radio transceiver.

Figure 15A:
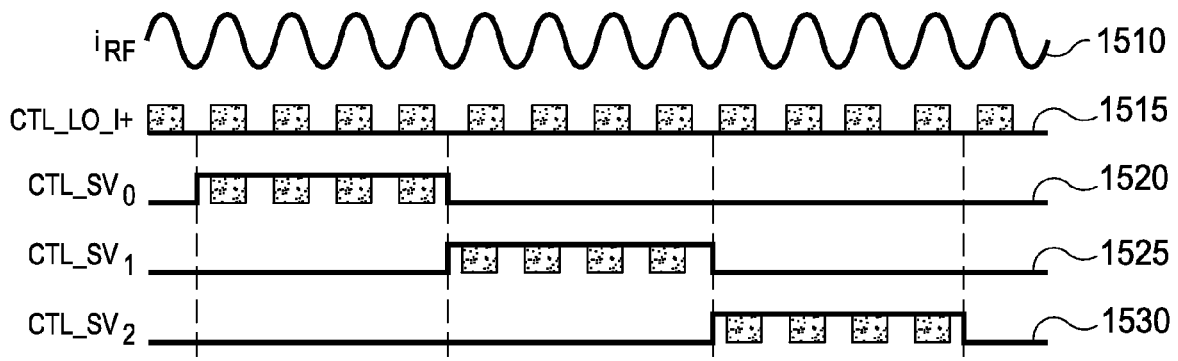
FIGS. 15a and 15b illustrate timing differences in rotating capacitor control signals when generated by independently executing clock generating circuitry and a single common clock generating circuit according to a preferred embodiment of the present invention.
Figure 15B:
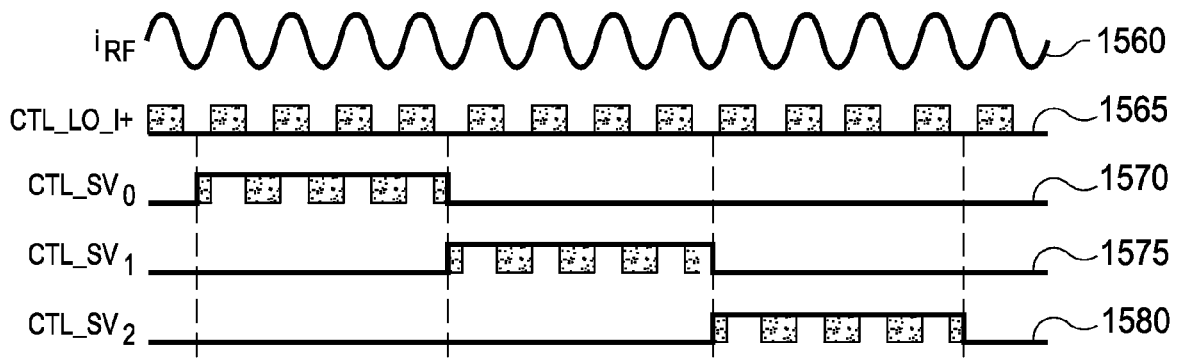

Referring now to FIGS. 15a and 15b, timing diagrams illustrate timing differences between rotating capacitor control signals that are generated by independently executing clock generating circuitry and signals that are generated by a single common clock generating circuit according to a preferred embodiment of the present invention. FIG. 15a illustrates rotating control signals that are generated by an independently executing clock generating circuit. A first curve 1510 displays an idealized RF current, labeled $I_{RF}$. A second curve 1515 displays a clock signal produced by an LO, in this example, the clock signal for the I+ signal path is displayed with positive portions (the portions that will close the RF switch permitting the integration of the RF current by rotating capacitors) of the signal shaded.

The next three curves 1520, 1525, and 1530 display three rotating capacitor control signals. Note that there may be other rotating capacitor control signals in the actual mixer, but that only three are displayed in FIG. 15a. Since the rotating capacitor control signals are derived directly from the clock signal for the I+ path, the rotating capacitor control signal transitions are well centered in the negative portions of the I+ LO. During the negative portions of the I+ LO signal, the RF switch is open and stops the flow of RF current. Therefore the rotating capacitors are not integrating the RF current. Since the switching of the active rotating capacitors occurs during an inactive period, no RF current is lost.

Referring now to FIG. 15b, a timing diagram illustrates rotating control signals that are generated by a common executing clock generating circuit that is derived from a clock signal that deviates in phase angle with its own clock according to a preferred embodiment of the present invention. A first curve 1560 displays the RF current and a second curve 1565 displays a clock signal produced by an LO, in this example, the clock signal for the I+ signal path is displayed with positive portions (the portions that will close the RF switch permitting the integration of the RF current by rotating capacitors) of the signal shaded. Notice that as displayed in FIG. 15b, the clock for this particular signal path is different from the I+ LO signal and there is the phase angle deviation of about 90 degrees between the two. The actual phase angle deviation between the reference LO signal (in this example, the I+ LO) and the clock used for a particular signal path may be any value. For example, in a four signal path mixer with in-phase and quadrature-phase clocks, the phase angle deviations may be about zero, 90, 180, and 270 degrees.

Due to the phase angle difference being about 90 degrees, the rotating capacitor control signals transition in the middle of a time period when the rotating capacitors are integrating the RF current instead of being in the middle of the inactive time period. However, due to the maintained accuracy in the duration of the rotating capacitor control signals, the rotating capacitors remain active for precisely the same amount of time as if their own independent clock generating circuit was generating the control signals. When one rotating capacitor transitions from active to inactive in the middle of integrating the RF current, another rotating capacitor transitions from inactive to active and integrates the remainder of the RF current, so the amount of RF current not integrated by the rotating capacitor may be very small.

Compounded with the relatively small capacitance of the rotating capacitors (approximately 30 times smaller than the history capacitor) and the fact that the history capacitor continually integrates the RF current, the total amount of RF current not integrated is negligible and does not affect the performance of the mixer.

As discussed previously, a bias voltage may be developed onto the rotating capacitors after the rotating capacitors have had their accumulated charges read out and optionally, reset. For example, the bias voltage on the rotating capacitors may be set to a specified value to prevent accumulated charge on the history capacitor from exceeding a maximum (or minimum) amount of charge that the capacitor can hold. Because the history capacitor is continually integrating the RF current, the maximum (or minimum) amount of charge that the history capacitor can hold may be of concern. If care is not taken, more (or less) charge can be placed onto the history capacitor than it can hold and the information represented by the charge is lost. Due to its periodic charge dumping and optional subsequent resetting (preferably, once every N RF cycles), the charge integrated by the rotating capacitors exceeding the rotating capacitor's maximum (or minimum) is not of as great a concern. One way to accomplish the setting of a bias voltage onto the rotating capacitors is through the use of a feedback correction loop, wherein a feedback current is integrated by a feedback capacitor, which in turn shares its charge with the rotating capacitors.

According to a preferred embodiment of the present invention, should the transconductance amplifier (for example, transconductance amplifier 505 (FIG. 5a)) have a low output resistance, whenever the history capacitor (for example, $C_H$ 515) and a rotating capacitor (for example, $C_R$ 530) is coupled to the transconductance amplifier 505, a portion of the charge on the two capacitors is leaked to the transconductance amplifier 505. This charge leakage reduces the amount of charge on the capacitors by a sufficient amount to possibly negate the need to perform a reset on the charge of the rotating capacitors. Therefore, depending on the output impedance of the transconductance amplifier, the resetting step may or may not be necessary.

The RF current that is being integrated by a sampling capacitor may, depending on orientation, increase or decrease the charge stored on the sampling capacitor. Note that the term sampling capacitor may represent a combination of the history capacitor and an active rotating capacitor. It should be noted that the RF current when averaged over an extended period of time, has zero mean. This implies that approximately half of the time, the RF current has a positive orientation and the other half of the time, the RF current has a negative orientation. This also implies that after integrating the RF current for an extended amount of time, the charge on the sampling capacitor is at a same level as when the integration period began. Therefore, if the sampling capacitor has no initial charge and if only a positive power supply were present, then, when the RF current is negative and there is not sufficient charge already on the sampling capacitor, information from the RF current will be lost because the sampling capacitor is not capable of storing a negative charge. The reduction of the number and types of power supplies on an integrated circuit results in lower device costs and less power consumption, therefore it is highly desirable to use as few power supplies as possible.

If a prespecified bias voltage were to be developed onto the sampling capacitor, then the sampling capacitor would be able to integrate the negative RF current, with the charge on the sampling capacitor decreasing each time a negative RF current was integrated. Correspondingly, each time a positive RF current was integrated, the charge on the sampling capacitor would increase. Given the zero mean nature of the RF current, the overall charge on the sampling capacitor would remain constant in the long run. It is common to place a bias voltage on the sampling capacitor that corresponds to a voltage drop across the capacitor that is equal to approximately one-half the value of the voltage supply. For example, if the voltage supply used was a 1.5-volt supply, then it is preferred to set the bias voltage on the sampling capacitor to 0.75-volts.

However, a large voltage bias implies a large amount of power consumed and greater nonlinearities due to lower gate-source voltage, Vgs. The amount of power consumed is proportional to the square of the voltage; therefore it is optimal to minimize the voltage bias, wherein the voltage bias remains sufficient to support the integration of a negative RF current, but not unnecessarily high such that power is expended unnecessarily. According to a preferred embodiment of the present invention, a preferred bias voltage on the rotating capacitor is approximately 450 millivolts (0.45 volts) for a current-mode sampling mixer with a 1.5-volt power supply.

As discussed previously, the rotating capacitors ($C_R$) may be initialized to a specified bias voltage value after the rotating capacitors have had their accumulated charges read out and reset. This bias voltage is then charge shared with the history capacitor to set the bias voltage on the history capacitor to a desired value. For example, the bias voltage on the history capacitor may be set to a specified value to prevent newly accumulated charge from increasing (or decreasing) the charge on the history capacitor to a level that is greater (or less) than what the capacitor can hold. An added benefit of placing a bias voltage on the rotating capacitor is to prevent the rotating capacitor from saturating (or depleting) as well, although this is an unlikely even due to the regular resetting of the charge on the rotating capacitors (or charge leakage with the transconductance amplifier). One way to accomplish the placing of a specified bias voltage onto the rotating capacitors is through the use of a feedback correction loop, wherein a feedback current is integrated by a feedback capacitor, which in turn shares its charge with the rotating capacitors resulting in a bias voltage being developed onto the history capacitors.

Figure 16A:
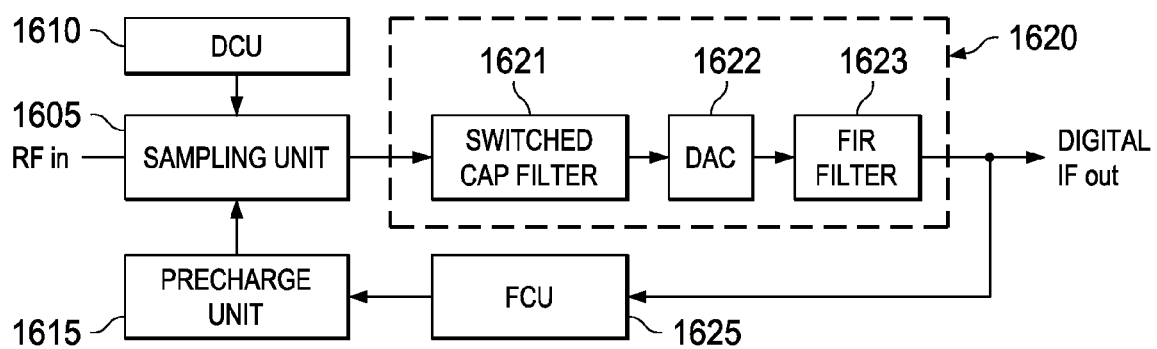

Referring now to FIG. 16a, a block diagram illustrates a high-level view of a portion of a current-mode sampling mixer system 1600 with a feedback correction loop used to set a prespecified voltage on the history capacitor according to a preferred embodiment of the present invention. FIG. 16a displays the portions of the mixer 1600 involved with the feedback correction loop and the integration of the RF current, other portions of the mixer 1600 are not displayed. The mixer 1600 includes: a sampling unit 1605, which is used to integrate the RF current using history and rotating capacitors (sometimes referred to collectively as sampling capacitors), a digital control unit (DCU) 1610 used to, among other things, provide timing signal for activation and deactivation of the rotating capacitors located within the sampling unit 1605, a precharge unit 1615 used to place a prespecified charge on the rotating capacitors, a filter block 1620 with a switched capacitor filter 1621, an analog-to-digital (ADC) converter 1622 and possibly, a FIR filter 1623 used to attenuate high-frequency noise (or example, quantization noise for a sigma-delta ADC) from the discrete-time sample stream provided by the rotating capacitors, and a feedback control unit (FCU) 1625 used for, among other things, controlling the amount of charge (bias voltage) being placed on the rotating capacitors. The output of the filter 1620 is sent to a digital signal processing unit (not shown), where the output receives further processing to produce data that is usable by the user. For example, the digital signal processing unit may be used to decode received data that had been encoded for transmission purposes, it may provide additional noise filtering, and/or it may provide error detection and correction, etc.

The FCU 1625 determines the amount of bias voltage that it places on the rotating capacitors by examining the discrete-time sample stream at the output of the filter 1620. According to a preferred embodiment of the present invention, by averaging the outputs of the filter 1620 over a period of time, the FCU 1625 can determine the amount of bias voltage that it needs to place on the rotating capacitors. By averaging the outputs of the filter 1620, the FCU 1625 measures a direct current (DC) offset of the outputs. The FCU 1625 then can compare the measured DC offset with a desired DC offset and calculate any needed change to the bias voltage it is applying on the rotating capacitors and indirectly, the history capacitor. For example, if the measured DC offset is lower than the desired DC offset, the FCU 1625 can raise the bias voltage on the rotating capacitors.

The FCU 1625, through control signaling, causes a bias voltage to be developed onto a feedback capacitor (not shown) located in the precharge unit 1615. According to a preferred embodiment of the present invention, the control signals from the FCU 1625 are directed to a current-mode digital-to-analog converter (DAC) (not shown) in the precharge unit 1615. Alternatively, the signals from the FCU 1625 can be used to control the operation of a switchable current source. The switchable current source to produce a current at a specified amount when receiving an appropriate command from the FCU 1625. The current from the DAC is used to develop the bias voltage onto the feedback capacitor. The bias voltage is developed onto the feedback capacitor through the integration of the current from the DAC by the feedback capacitor. The actual mechanism is similar to the rotating capacitors integrating the RF current, although the feedback capacitor is not switched as frequently as the rotating capacitors.

Referring now to FIG. 16b, a block diagram illustrates a detailed view of the precharge unit 1615 used to develop a bias voltage onto the rotating capacitors 1690 and 1691 according to a preferred embodiment of the present invention. Note that FIG. 10 previously described a precharge unit with less detail. The precharge unit 1615 as displayed in FIG. 16b is used to precharge the rotating capacitors for a signal path in the current-mode sampling mixer.

A current source 1652, such as a current-mode DAC as described previously, receives control signals from the FCU 1625 and provides a current of specified magnitude ($i_{fbck}$). The FCU 1625 may issue commands to specify the duration of the current. Alternatively, the FCU 1625 determines the needed amount of current that the current source 1652 is to provide and simply controls the duration of the current provided by the current source 1652 by switching the current source 1652 on and then off for the desired duration. As configured, only one of two switches 1655 and 1660 is closed at a given time. The switches 1655 and 1660 are controlled by signals generated by the DCU 1610. According to a preferred embodiment of the present invention, the signals generated by the DCU 1610 are such that only one switch (either 1655 or 1660) is closed at a given time, permitting the current to flow to one feedback capacitor. When one of the switches (1655 or 1660) is closed, current from the current source 1652 is available to charge a feedback capacitor, $C_F$. For example, assuming that switch 1655 is closed, the current can flow through the switch and be accumulated by a feedback capacitor 1675. Should switch 1660 be closed, the current would then be accumulated by a feedback capacitor 1680.

A switch 1665 or 1670 controls the coupling of the feedback capacitor 1675 or 1680 to the rotating capacitors 1690 or 1691. Once again, the switch 1665 or 1670 is controlled by signals generated by the DCU 1610. According to a preferred embodiment of the present invention, one switch (either 1665 or 1670) is closed at a time, permitting the charge accumulated on the feedback capacitor to be shared with the rotating capacitors and then the history capacitor.

Another switch 1685 is used to reset (remove) any residual charge on the rotating capacitors after the rotating capacitors have had their charge read out and prior to sharing the charge of the feedback capacitor. Controlled by a signal generated by the DCU 1610, the switch couples one bank of rotating capacitors to electrical ground, removing any charge on the capacitors.

The accumulation of the charging current $i_{fbck}$ for a time duration T on the feedback capacitor $C_F$ yields an incremental accumulation of charge: $\Delta Q_{in} = i_{fbck} * T$. This charge is added to the total charge on the feedback capacitor at a discrete time instance, k, as:

$$Q_F(k) = Q_F(k-1) + \Delta Q_{in} = Q_F(k-1) + i_{fbck} * T \quad (1)$$

When the charge of the feedback capacitor is shared with the rotating capacitor bank with a collective capacitance of $M*C_R$, the charge depleted from the feedback capacitor is dependent on the relative capacitor values and can be expressed as:

$$\Delta Q_{out}(k) = \frac{MC_R}{C_F + MC_R} * Q(k) \quad (2)$$

According to a preferred embodiment of the present invention, a constant charging current is used to charge the feedback capacitor. Because of this, the charge on the feedback capacitor will continue to accumulate until the net charge intake becomes zero, e.g., $Q_{in}=Q_{out}$. Equilibrium is reached when $\Delta Q_{in}(k)=\Delta Q_{out}(k)$. Using the above expressions, the equilibrium condition for a discrete time instance, k, may be expressed as:

$$i_{fbck} * T = \frac{MC_R}{C + MC_R} * Q_F(k) \quad (3)$$

The above expression can be transformed to provide the equilibrium voltage (using the basic voltage and charge relationship $V_F = Q_F/C_F$):

$$V_{F,eq} = i_{fbck} * T * \frac{C_F + MC_R}{C_F + MC_R} \quad (4)$$

The $\Delta Q_{out,eq}$ charge transfer into the rotating capacitor bank at equilibrium will result in a voltage on the capacitor bank equal to $$V_R = \frac{i_{fbck} * T}{MC_R}.$$

The bias voltage then developed onto the history capacitor is equal to $$V_H = \frac{i_{fbck} * T}{MC_R},$$

since the voltage transfer function between the rotating capacitor bank and the history capacitor is unity. Therefore, since $MC_R$ and $i_{fbck}$ are known, it is possible to calculate a time T for a desired $V_H$ value.

Referring back now to FIG. 11a, the block diagram illustrates a detailed view of a portion of a current-mode sampling mixer 1100 with circuitry to allow the precharging of rotating capacitors to a prespecified bias voltage according to a preferred embodiment of the present invention. A sampling unit 1110 includes a pair of rotating capacitor banks 1111 and 1112 is used to integrate RF current. The use of the multiple rotating capacitor banks to allow sufficient time for charge read out was discussed previously. Coupled to the sampling unit 1110 is a precharge unit 1120. The precharge unit 1120 is used to reset the charge stored on the rotating capacitor banks 1111 and 1112, and set the bias voltage on the rotating capacitors in a selected rotating capacitor bank. The function of the precharge unit 1120 was discussed earlier in conjunction with FIG. 16b.

A dump unit 1115 with output buffer, also attached to the sampling unit 1110, permits the charge accumulated on the rotating capacitors in a rotating capacitor bank to be dumped (read out). When a switch 1116 is closed, the inactive capacitor bank is coupled to an output buffer 1117 and a buffer capacitor 1118. The function of the dump unit 1115 with output buffer was discussed earlier in conjunction with FIG. 8. A similar set of circuitry provides the sampling, reset, precharge, and dumping functionality for a second signal path.

Referring back now to FIG. 12, a timing diagram illustrates the relationship between various signals used in the mixer 1100 according to a preferred embodiment of the present invention.

The timing trace 1230 displays the "CTL_D" signal used to couple the rotating capacitor bank to the buffer capacitor, $C_B$ (discussed in FIG. 8), allowing the charge from the rotating capacitors to be shared with the buffer capacitor, resulting in the voltage on the rotating capacitors appearing on the output of the buffer. The "CTL_D" signal is sometimes referred to as the DUMP signal.

The timing trace 1235 displays the "CTL_R" signal used to couple an inactive rotating capacitor bank (the one that is not currently integrating the RF current) to electrical ground. The "CTL_R" signal is commonly referred to as the RESET signal. The timing trace 1240 displays the "CTL_PB" signal used to couple a feedback capacitor, $C_F$, to rotating capacitor bank B, while the timing trace 1245 displays the "CTL_PA" signal used to couple a different feedback capacitor, $C_F$, to rotating capacitor bank A. For example, the "CTL_PA" and "CTL_PB" signals are used to control the switches 1665 and 1670 from FIG. 16b.

The timing trace 1250 displays the "CTL_FB" signal used to allow the feedback capacitor, $C_F$, to integrate the feedback current, $i_{fbck}$, intended for rotating capacitor bank B. The timing trace 1255 displays the "CTL_FA" signal, performing the same operation as the "CTL_FB" signal except for rotating capacitor bank A. For example, the "CTL_FA" and "CTL_FB" signals are used to control the switches 1655 and 1660 from FIG. 16b.

Taking a closer look at the charge dump, reset, and precharge timing curves to provide a better understanding of the timing involved in these operations. Starting at the first pulse (at the left side of FIG. 12) of the "CTL_D" curve 1230, for example, when the "CTL_D" curve 1230 transitions low, the charge dump switch opens and ends the charge read out of the selected rotating capacitor bank. After the first pulse of the "CTL_D" curve 1230 transitions low, the "CTL_R" curve 1235 transitions high, resulting in the resetting (removal) of any residual charge on the selected rotating capacitor bank. Once the "CTL_R" curve transitions back low, the "CTL_PB" curve 1240 transitions high, resulting in the charge sharing of the accumulated charge with the selected rotating capacitor bank. Subsequent to the transition of the "CTL_PB" curve 1240 back low, the "CTL_FB" curve 1250 transitions high to enable the integration of the $i_{fbck}$ current by the feedback capacitor. Additionally, the "CTL_R" curve 1235 transitions high to reset residual charges on the other rotating capacitor bank and then the "CTL_PA" curve 1245 transitions high to share the charge accumulated on a feedback capacitor with a rotating capacitor bank. Notice that the curves "CTL_FB" 1250 and "CTL_FA" 1255 are essentially complementary (with exception of small non-overlapping periods) to ensure that the charge sharing between the two sets of rotating capacitor banks and feedback capacitors are exclusive.

Referring now to FIG. 17, a graph displays the current needed to place a bias voltage of desired value onto a history capacitor through charge sharing with a feedback capacitor with and without resetting the residual charge on the feedback capacitor according to a preferred embodiment of the present invention. A first curve 1710 displays the amount of current as a function of time needed to place a desired bias current on a history capacitor through the use of charge sharing with a feedback capacitor when the feedback capacitor is reset after each time that it is used to share its charge with the history capacitor. Due to the fact that any residual charge is lost, a relatively large amount of current is required to bring the feedback capacitor from its initial charge value of zero to the required amount of charge.

A second curve 1720 displays the amount of current as a function of time needed to place a desired bias current on a history capacitor through the use of charge sharing with the feedback capacitor when the residual charge on the feedback capacitor is maintained after each time it is used to share its charge with the history capacitor. Since there is a non-zero charge on the feedback capacitor, the amount of current needed to restore the charge on the feedback capacitor to the required charge is less. Additionally, according to a preferred embodiment of the present invention, the capacitance of the feedback capacitor is significantly larger than the capacitance of the rotating capacitors (on the order of 30 or more); the amount of charge lost during each charge sharing operation is small. The amount of charge lost is discussed previously.

The curves displayed in FIG. 17 can be generated by solving for $i_{fbck}$ in expression (4), which was discussed previously. Notice also that the curves in FIG. 17 are not to scale and the actual magnitudes of the actual charging currents used to charge the feedback capacitors may be different. However, the graph does display that there may be a significant difference in the amount of current needed to bring the feedback capacitor to full charge when it is only partially discharged as opposed to being completely discharged. This significant reduction in the charging current leads to a large reduction in power consumption since the feedback capacitors must be recharged frequently. For example, if the current-mode sampling mixer is intended for use in a Bluetooth communications system, the LO will be generating a 2.4 GHz clock, with four rotating capacitors per bank with eight LO cycles per rotating capacitor, the two feedback capacitors per signal path will require charging: 2.4 GHz /4/2/8=75 MHz, or 75 million times a second. Additionally, there are four signal paths per mixer. Therefore, any reduction in the charging current can result in a large overall reduction in the power consumption. Also, whenever switches are switched, current sources are turned on and off, and current injected into the system, noise is introduced. Hence, an added benefit of the present invention is an overall reduction in the amount of noise injected into the mixer. Notice that the plots show minor variations in the charging currents once the charging algorithm has reached steady state. The variations may be the result of the feedback control unit adjusting the charge on the feedback capacitor to properly set the bias voltage.

Alternatively, rather than bringing the feedback capacitor back to a full charge after it shares its charge with the rotating capacitor bank, the charge on the feedback capacitor may be brought to a different charge level. Reasons for this include the detection of a different DC offset on the outputs of the filter that require special compensation, or for performance reasons, it is not desired to bring the feedback capacitor's charge back to pre-charge sharing levels.

Variables in the manufacturing process may lead to significant variations in the nominal values of circuit components in integrated circuits. For example, different fabrication runs may lead to variations of up to 30 percent difference, plus or minus, from the nominal value of circuit components such as capacitors, resistors, etc. Typically, the wide variation is not seen between circuits from the same fabrication run, but between circuits from different fabrication runs and fabrication plants. Therefore, it is not feasible to simply fix values and amounts such as the charging current, etc. It is preferred that the mixer be able to make adjustments to conform to whatever value its internal components happen to be.

According to a preferred embodiment of the present invention, it is possible to determine the necessary amount of charging current needed to provide the desired bias voltage across the rotating capacitors (using expressions (1-4) discussed previously. For example, should the capacitance of the rotating capacitors be significantly different from the nominal value of the rotating capacitor, a similar amount of charge shared from the feedback capacitor would result in a significantly different bias voltage on the rotating capacitors. Additionally, if, due to manufacturing differences, the value of the feedback capacitor were smaller than its nominal value, then a fixed charging current would result in a larger voltage on the feedback capacitor than desired. This in turn, would result in a precharging of the rotating capacitors to a bias voltage that is greater than desired.

As an alternative to the use of expression (4) to calculate the amount of time required to place a desired bias voltage onto the history capacitor, an iterative approach can be used to more rapidly and accurately place a desired bias voltage onto the history capacitor. Referring back to FIG. 16a, wherein the FCU 1625 uses the filtering unit 1620 to calculate what is known as a direct current (DC) offset of the signals produced by the sampling unit 1605. The DC offset of the signals is then used by the FCU 1625 to control the current source 1652 (FIG. 16b), such as a current-mode DAC, and specify the amount of current used to charge the feedback capacitor, $C_F$, in the precharge unit 1615. Alternatively, the DC offset is provided directly to the current source 1652 and the current source 1652 makes adjustments to the amount of current it provides to the feedback capacitor. Through several iterations of the measure the DC offset and specify the current steps, the FCU 1625 will be able to determine the proper amount of current to develop the desired amount of bias voltage on the rotating capacitors.

The iterative calibration procedure outlined above may be performed each time the system containing the radio transceiver is powered up, for example. Alternatively, if the results of previous calibration procedures are saved to memory and then retrieved when a calibration is needed, then the iterative calibration procedure may not need to be performed (or a highly protracted procedure is performed). In yet another alternative, the FCU 1625 measures the DC offset in the filtering unit 1620 and makes adjustments (if any) in the signals it is providing to the current source 1652. The current source 1652 would then change the amount of charging current that it provides to the feedback capacitor. With a different amount of charge stored in the feedback capacitor, a different amount of charge would be shared with the rotating capacitors during the precharge operation, resulting in a different bias voltage. With a different bias voltage on the rotating capacitors, the samples of the RF current produced by the rotating capacitors will have a Is different DC offset. The DC offset is then calculated by the FCU 1625 and the adjustment continues until the desired DC offset is attained.

As the current-mode mixer produces a discrete-time sample stream from the RF current, and as the discrete-time sample stream is converted into a digital bitstream by a quantizer or analog-to-digital converter (ADC), digital circuitry is used to process the digital information as well as generating timing and control signals. While the digital processing may proceed at a relatively constant rate, there may be certain periods of time when there is a flurry of digital activity, a burst of digital activity. During such periods, the digital circuitry can develop a large amount of digital noise. Examples of the digital circuits responsible for generating the noise could be, but are not limited to the synthesizer (also commonly referred to as the local oscillator) and the digital baseband processor. The digital noise generated by the digital circuitry can be carried back to the current-mode mixer on the power and ground planes, along a common substrate, as well as other signal lines. The digital noise can corrupt the data in the discrete-time sample stream, resulting in lower system performance.

Referring now to FIG. 18a, a graph displays a portion of a discrete-time sample stream (DTSS) 1800 produced by a current-mode sampling mixer according to a preferred embodiment of the present invention. The DTSS 1800 is a sequence of voltage values and is displayed as a sequence of rectangular boxes (for example, boxes 1802 and 1804), with the height of the boxes representing the magnitude of the voltage value. The width of the boxes is constant and with the horizontal axis of the graph being elapsed time, the width of the boxes represents the duration of the sample, or the sampling period. Note that the height and width of the boxes used to represent the samples are not meant to be indicators of what the actual discrete-time samples would look like, but are to provide an idea as to their appearance. Each voltage value in the DTSS 1800 is produced by reading out a charge stored on the rotating capacitors. After the specified period of time (the sampling period), a new sample is generated by reading out a new charge stored on the rotating capacitors.

Figure 18B:
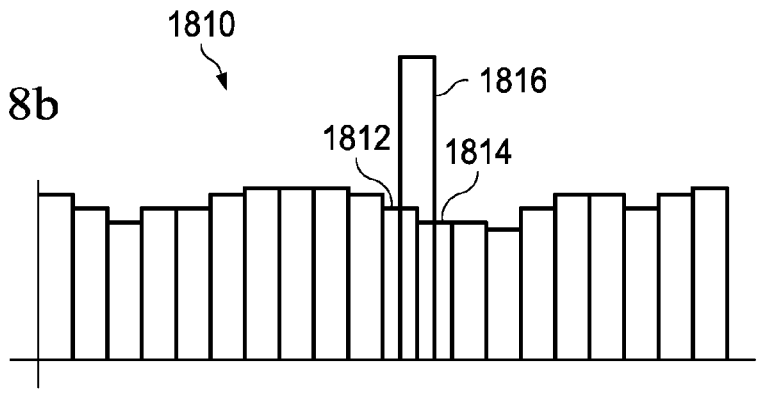

Referring now to FIG. 18b, a graph displays a portion of the DTSS 1810 with a digital noise glitch being superimposed onto the particular portion of the DTSS according to a preferred embodiment of the present invention. Notice that for illustrative purposes, the portion of the DTSS displayed in FIG. 18b is identical to the portion of the DTSS displayed in FIG. 18a.

As with the samples in the DTSS, the noise glitch is displayed as a rectangular box 1816 where the box's height representing the voltage magnitude of the noise glitch and the box's width representing the duration of the noise glitch. Note that the duration of the noise glitch may be equal to, less than, or greater than the duration of a sample. As displayed, the noise glitch 1816 has a magnitude that is significantly greater than any of the samples displayed in FIG. 18b and lies across two samples (displayed as boxes 1812 and 1814). If left uncorrected, the noise glitch 1816 effectively destroys any information contained in the two samples 1812 and 1814. Once again, note that the noise glitch may not be accurately represented as the rectangular box 1816. The purpose of the rectangular box 1816 is to show how a noise glitch may superimpose itself on top of existing discrete-time samples.

In certain instances, the presence of noise generated by certain digital circuitry can be predicted before it actually is generated. For example, in a phased-lock loop (PLL), a phase detector update event can be readily predicted. The prediction is possible due to the use of digital circuitry to generate control signals. Therefore, if certain control signals are used to activate certain digital circuits that are known to generate a significant amount of noise, then the occurrence of such a control signal can be predicted and proper action can be taken to minimize (or possibly eliminate) the effect of the noise generated by the circuits.

Figure 18C:
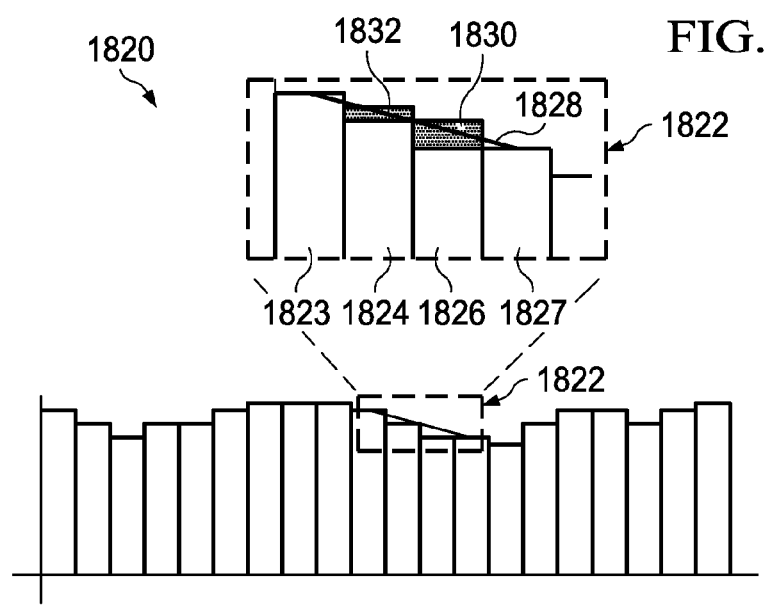

Referring now to FIG. 18c, a graph displays a portion of a DTSS 1820 with a corrected noise glitch according to a preferred embodiment of the present invention. According to a preferred embodiment of the present invention, some bursts of digital activity can be predicted. For example, digital activity by a digital synthesized local oscillator can be predicted with high probability, while digital activity by a baseband processor may not be as accurately predicted. Fortunately, circuitry for generating a local oscillator is located relatively close to the current-mode mixer while the baseband processor is far away, because the amount of noise induced upon the discrete-time sample stream is reduced as the distance separating the circuitry increases.

FIG. 18c displays the DTSS 1820 with corrected samples that were damaged by a noise glitch, such as one displayed in FIG. 18b. Highlight 1822 provides an exploded view of the corrected samples. When a noise glitch is predicted, a digital signal processor (or some other processing element) can determine a last valid sample 1823 that is not affected by the noise glitch and it can also determine a first valid sample 1827 after the noise glitch is over. Based on the last valid sample 1823 and the first valid sample 1827 (and other additional valid samples depending on the sample correction algorithm), the digital signal processor may use interpolation, extrapolation, linear prediction, or other techniques to derive values for the samples that are damaged by the noise glitch.

Should a noise glitch damage more than a single discrete-time sample (this is a likely event if the duration of the noise glitch is approximately equal to the duration of a single discrete-time sample or greater), then the correction of the first corrupted sample would use valid samples as described above. However, the correction of the second and any subsequent corrupted samples may require the use of previous corrected samples in the sample correction algorithm. For example, in a simple linear prediction algorithm that generates a corrected sample from the discrete-time sample immediately prior to it, the first corrected sample might use the last valid discrete-time sample prior to the noise glitch. However, if there were a second corrupted sample, then the correction of the second corrupted sample would require the use of the first corrected sample.

For example, in FIG. 18c, samples 1824 and 1826 are damaged by a noise glitch, although in FIG. 18c, they are displayed as if they had not been damaged. In this example, the digital signal processor uses first order linear interpolation to derive values for the damaged samples 1824 and 1826. The digital signal processor uses the last and first valid samples 1823 and 1827 and draws a line 1828 between their two magnitudes. The digital signal processor then creates the corrected samples by setting the magnitudes of the corrected samples to be equal to the value of the line drawn between the two valid samples. According to a preferred embodiment of the present invention, the magnitude of the corrected sample is determined at a point midway in the duration of the sample. Alternatively, the magnitude may be determined at any point during the duration of the sample. The corrections for the two damaged samples 1824 and 1826 are displayed as shaded boxes 1830 and 1832. According to a preferred embodiment of the present invention, the digital signal processor may chose to use higher orders of linear interpolation or it may use extrapolation or linear prediction or one of many other possible methods.

Figure 18D:
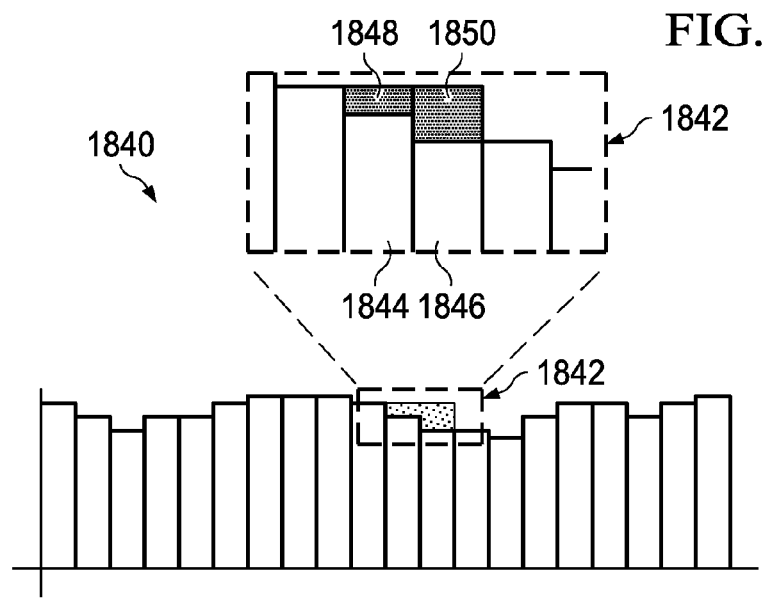

Referring now to FIG. 18d, a diagram illustrates a portion of a DTSS 1840 with corrected samples damaged by a noise glitch according to a preferred embodiment of the present invention. Highlight 1842 in FIG. 18d displays two samples 1844 and 1846 that also appear during a predicted noise glitch. Rather than performing interpolation or extrapolation, which can consume a certain amount of processing resources, the digital processing unit simply copies the last valid sample prior to the start of the noise glitch and uses them in place of the samples 1844 and 1846 produced during the noise glitch, with shaded regions 1848 and 1850 representing the error between the generated samples and the actual samples. Alternatively, the digital processing unit may choose to use the sample after the noise glitch to replace the samples generated during the noise glitch.

Referring now to FIG. 19, a block diagram illustrates a high-level view of a portion of a current-mode sampling mixer system 1900 with glitch reduction circuitry according to a preferred embodiment of the present invention. The system 1900 includes a basic current-mode sampling mixer with a feedback control unit as described in FIG. 16*a*. In addition to the basic current-mode sampling mixer, the system 1900 includes circuitry to perform glitch reduction. The glitch reduction circuitry includes a clock activity detector 1930, a sample corrector unit 1933, which in turn, includes a sample predictor 1935, a delay unit 1940, and a multiplexer 1945. The sample predictor 1935 may predict samples through the use of interpolation, extrapolation, linear prediction, or any of a wide variety of prediction algorithms collectively known as statistical signal processing. Accord to a preferred embodiment of the present invention, the sample predictor 1935 uses delayed version of samples from the filter unit 1920, the delay unit 1940 may be a part of the sample predictor 1935.

As described previously, the clock activity detector 1930 is a circuit that predicts the occurrence of a burst of digital activity through the monitoring of clock signals. When the clock activity detector 1930 detects certain activity on its monitored clock signals that indicates an impending burst of digital activity, the clock activity detector 1930 asserts a signal line to mark the impending burst of digital noise corresponding to the digital activity. According to a preferred embodiment of the present invention, the signal line is referred to as a "mark" signal line. While displayed as a single line between the clock activity detector 1930 and the sample corrector 1933, the line may represent a plurality of different signal lines, of which, the "mark" signal line is one.

According to another preferred embodiment of the present invention, the clock activity detector 1930 may use alternative techniques to trigger the assertion of the "mark" signal line. For example, the clock activity detector 1930 may be configured to continuously monitor the output of the filter unit 1920 and the sample predictor 1935. The required connections for the clock activity detector 1930 to monitor the output of the filter unit 1920 are not shown. By continually monitoring the outputs of these two units, the clock activity detector 1930 can compare the observed samples (the output of the filter unit 1920) and the predicted samples (the output of the sample predictor 1935) and when the two sample streams vary by a margin that exceeds some predetermined amount, the clock activity detector 1930 can assert the "mark" signal line, signifying that a noise glitch has occurred and that the samples produced by the sampling unit 1905 are corrupted.

The "mark" signal line may also be used by circuitry that is external to the mixer system 1900. For example, circuitry such as timing recovery circuits, gain recovery circuits, or data detectors that are connected to the discrete-time sample stream output of the mixer system 1900 can also be provided with the "mark" signal line. These circuits (and others) will then be notified of the presence of corrected (or corrupted) samples and to take proper precautions in regards to taking any action related to decoded information carried in these corrected (or corrupted) samples. For example, should a timing recovery circuit decode a corrected sample as some unusual behavior, the presence of the "mark" signal line marking the corrected sample can warn the timing recovery circuit to place less weight on information derived from the corrected sample.

According to a preferred embodiment of the present invention, when "mark" signal line is asserted, the sample corrector 1933, which is coupled to the output of a filter unit 1920, begins to correct samples produced by the current-mode sampling mixer. The sample predictor 1935 may implement some sort of interpolation, extrapolation, linear prediction, or one of many other algorithms for correcting the samples that are damaged by the noise glitch. These various algorithms fall into a class of algorithms commonly referred to as statistical signal processing. Statistical signal processing is well known by those of ordinary skill in the art of the present invention and will not be discussed any further.

At the same time that the sample predictor 1935 is generating corrected samples, the output of the filter unit 1920 is being stored in the delay block 1940. The delay block 1940 may be made from a memory, a simple serial shift register, or some other register. Notice that the delay bock 1940 is not needed if the sample predictor 1935 is using extrapolation or linear prediction. The delay block 1940 is used mainly to support interpolation, which uses valid samples from both before and after the occurrence of the noise glitch. Preferably, the delay block 1940 would have a programmable delay so that the delay imposed on the discrete-time sample stream can be set for a number of samples that would be affected by the noise glitch, with perhaps a small additional amount of delay to account for any latency required by the sample predictor 1935 to create its corrected samples. An upper limit on the delay would be dependent upon the order of the interpolation method used to predict the value of the damaged samples. Additionally, the delay imparted by the delay block 1940 should approximately match the delay present in the sample predictor 1935.

The outputs of the delay block 1940 and the sample predictor 1935 are inputs to the multiplexer 1945. Preferably, the multiplexer 1945 is controlled by the "mark" signal line. According to a preferred embodiment of the present invention, when the "mark" signal line is asserting that there is a burst of digital noise, then the multiplexer 1945 will select the output of the sample predictor 1935 and when the "mark" signal line is not asserting that there is a burst of digital noise, the multiplexer 1945 will select the output of the delay block 1940.

The operation of the glitch reduction circuitry as described above performs its glitch reduction in the digital domain by correcting digital samples using a sample predicting algorithm based on valid digital samples that immediately precede and follow the noise burst. Sample prediction in the digital domain carries with it an inherent advantage wherein the amount of time between the occurrence of the noise glitch and when the samples damaged by the noise glitch comes out of the filter unit 1920 is quite large and is easily determined. The ability to accurately and easily determine this latency gives the sample predictor 1935 ample opportunity to obtain valid samples that occur prior to the noise glitch damaged samples. Thus, correcting the damaged samples in the digital domain is a relatively straight-forward task.

As an alternative to digitally correcting the corrupted samples, the corrupted samples can be corrected in the analog domain. One may attempt to use the existing feedback control unit (FCU) 1925 to provide important information regarding the corrupted samples from the filter unit 1920. This feedback information can then be provided to the rotating capacitors and adjustments may be made. Unfortunately, the feedback loop made up of the sampling unit 1905, the filter unit 1920, the FCU 1925, and the precharge unit 1915 has a large built-in latency (on the order of microseconds) that is several orders of magnitude greater than the duration of a single sample (on the order of nanoseconds). Therefore, by the time any feedback information can be provided regarding the corrupted samples, the noise glitch is long gone and samples are no longer being corrupted.

An alternate method that does not require feedback information to create corrected samples in the analog domain is to create the corrected samples using the same mechanism normally used to create the discrete-time samples, namely the rotating and history capacitors within the sampling unit 1905. As discussed previously, the RF current is integrated by the history capacitor and the rotating capacitors, preferably one rotating capacitor at a time. The charge stored on the rotating capacitors is then used to create the discrete-time sample. Since the charge is stored on a capacitor and the process of creating a discrete-time sample is not entirely destructive, a significant percentage of the original charge on the rotating capacitor (if not the entire amount) remains after the discrete-time sample is created, then the remaining (or residual) charge can be used to create the corrected samples.

According to a preferred embodiment of the present invention, after the clock activity detector 1930 predicts/detects a burst of digital activity that would lead to digital noise or if it detects that the difference between the predicted samples and the observed samples exceeds a prespecified amount, the clock activity detector 1930 sends a signal to a precharge unit 1915. The signal to the precharge unit 1915 has the effect of stopping the flow of the RF current to the history capacitor, $C_H$ (for example $C_H$ 420 from FIG. 4a), and rotating capacitors, $C_R$. This stoppage of the RF current is readily achieved by stopping the switching of the RF switches, for example $S_0$ 410. In addition, the switches controlling the rotating capacitors, such as switch $S_1$ 415, are also stopped. With the flow of RF current stopped, the history and rotating capacitors are no longer integrating the RF current; hence the generation of the samples is stopped. The clock activity detector 1930 also signals the sample predictor 1935 to tell it that it does not need to generate any corrected samples. Additionally, a signal may be provided to a feedback control unit (FCU) 1925 to tell it to stop providing feedback information to the rotating capacitors. The feedback information as provided by the FCU 1925 may corrupt the charge already present on the rotating capacitors. For the majority of noise glitches, the slow rate at which the feedback information is provided through the FCU to the rotating capacitors will not result in significant change to the residual charge on the rotating capacitors.

Preferably, the flow of the RF current is stopped for the duration of the noise glitch. As discussed previously, the generation of samples is performed by reading the charge accumulated on one or more of the rotating capacitors. During normal operations, only one rotating capacitor is accumulating the RF current along with the history capacitor at a given time. The remaining rotating capacitors wait their turn to accumulate the RF current. The rotating capacitors that are not actively accumulating the RF current have either just completed their turn at accumulating the RF current or are awaiting their turn. Therefore, if there are M rotating capacitors in the system 1900, one is actively accumulating the RF current, the remaining M−1 rotating capacitors provide a snap-shot of a recent history of the RF current. For example, if each rotating capacitor accumulates the RF current for eight RF cycles and there are M rotating capacitors in the system 1900, then at any given time, there is a snap-shot of the RF current of up to the previous (M−1)*8 RF cycles.

By reading the charge accumulated on the M−1 rotating capacitors that were not actively accumulating the RF current when the noise glitch was detected/predicted, the corrected samples can be generated from recently accumulated RF current while the flow of the RF current is stopped. The corrected samples are, in actuality, being created from the last valid sample(s) of the RF current prior to the occurrence of the noise glitch. Since the corrected samples are being created at the point where the samples are being generated, there is very little or no latency between the detection/prediction of the noise glitch and the creation of the corrected samples. According to a preferred embodiment of the present invention, when the corrected samples are created in the analog domain at the sample creation point, the delay block 1940 and the multiplexer 1945 are not used for purposes of sample prediction.

According to a preferred embodiment of the present invention, the charge on the one rotating capacitor that accumulated the RF current prior to the currently active rotating capacitor is used to generate the corrected samples. This in effect will use the last valid sample to create the corrected samples. According to another preferred embodiment of the present invention, the charge from a certain number, K, of the most recent rotating capacitors is used to create the corrected samples. The charge on these K rotating capacitors can be shorted together to provide an average of the last K valid samples prior to the noise glitch.

The use of the charge stored on the rotating capacitors to provide a snap-shot of recent RF current history requires that when the rotating capacitors are read out, the residual charge must be preserved. Therefore, the previously optional charge reset operation is not performed. If the charge on the rotating capacitors is reset, then any information stored on the rotating capacitors is lost. However, the precharge operation where a bias voltage of a predetermined level is placed on each of the rotating capacitors continues to be performed. The bias voltage is maintained to ensure that the rotating capacitors and the history capacitor are capable of accumulating a large negative RF current. However, since the bias voltage is at a constant level, it is possible to maintain an account of how much charge is added to the rotating capacitors and this bias voltage can be removed should the need for generating corrected samples from the charge on the rotating capacitors arise.

Alternatively, given that the history maintained by the rotating capacitors is (M−1)*(the number of RF cycles per rotating capacitor)*(duration of each RF cycle) seconds long, and if there is not a need to maintain a history of that duration, perhaps due to the maximum permitted duration of a correctable noise glitch being less than the maintainable history, then some of the rotating capacitors may have their charge reset after they have been inactive for a certain number of RF cycles. For example, if there are a total of six rotating capacitors in the system 1900 and if only four rotating capacitors are needed to maintain the required history of the RF current, then the rotating capacitor that is furthest from obtaining access to accumulate the RF current may have its charge reset (the sixth rotating capacitor is actively integrating the RF current).

According to yet another preferred embodiment of the present invention, when a period of digital noise is predicted, the mixer may continue to produce discrete-time samples as usual. However, the samples produced during the time when the digital noise is present (or has been predicted to be present) are marked. The marking can be performed by appending a special marker to the samples or setting a particular bit in a memory or register in a digital portion of the circuitry or one of many other ways of denoting the special status of these samples. Then, once the samples are converted into digital values, the digital processing unit will notice that the samples have been marked and take special action, such as interpolating, extrapolating values, holding a previous value, linear prediction, etc.

Referring now to FIG. 20, a block diagram illustrates a wireless communications device 2000 containing a direct sampling mixer according to a preferred embodiment of the present invention. As discussed previously, the direct sampling mixer of the present invention is operable at any radio frequency and with any data encoding and transmission mechanism. In actuality, the direct sampling mixer is also operable in a wired communications system as well.

The direct sampling mixer of the present invention is contained in an RF transceiver 2010 that is coupled to an antenna 2020. The antenna 2020 is responsible for receiving analog RF signals transmitted over-the-air. Additionally, the antenna 2020 may be used to transmit analog RF signals originating from the wireless device 2000. The RF transceiver 2010 is responsible for taking the analog RF signals received by the antenna 2020 and converting it into a digital data stream that is usable by the remainder of the wireless device 2000. Since the RF transceiver 2010 can transmit signals as well as receive them, the RF transceiver 2010 is also responsible for converting a digital data stream into an analog signal suitable for transmission.

After the RF transceiver 2010 receives and then converts the analog RF signal into a digital data stream by an analog-to-digital converter (ADC) or a quantizer (neither shown) followed by filtering and other post processing, the digital data stream is transferred to a digital baseband (DBB) controller 2030. The DBB controller 2030 is responsible for taking the digital data stream and performs any necessary digital signal processing on it to convert the digital data stream in to a stream of user usable data. Examples of the processing performed by the DBB controller 2030 may include, but is not limited to: digital filtering, data encoding and decoding, error detection and correction, and communications protocol software stack and applications. The DBB controller 2030 is coupled to a memory 2040 that may contain a read-only memory (ROM), a random access memory (RAM), flash programmable memory, etc. The memory 2040 can be used to store necessary subroutines used in the DBB controller 2040, configuration data, scratch memory, etc.

The DBB controller 2030 may be coupled to some other digital device via a host interface. The host interface may be a proprietary interface or it may be adherent to an interconnection standard such as: RS-232, universal serial bus, Firewire, IEEE 802.11, PCcard, etc. The host interface allows the connection of a digital device to the wireless device 2000 via the DBB controller 2030. Examples of digital devices include computers, multi-media devices, Internet appliances, storage devices, etc.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit comprising:
   a history capacitor and a rotating capacitor, both coupled to a radio frequency (RF) input, the history and rotating capacitors to simultaneously integrate an RF current provided by the RF input to produce a charge on the history and rotating capacitors;
   a read-out circuit coupled to the history and rotating capacitors, the read-out circuit to measure the charge on the rotating capacitor; and
   a timing circuit coupled to the history and rotating capacitors and the read-out circuit, the timing circuit to produce clock signals to control the operation of the history and rotating capacitors and the read-out circuit.

2. The circuit of claim 1, wherein the history capacitor and the rotating capacitor periodically integrate the RF current.

3. The circuit of claim 2, wherein the history and rotating capacitors develop a charge depending on a magnitude and a phase of the RF current each time the RF current is periodically integrated.

4. The circuit of claim 2, wherein after a specified number of integrating periods, the read-out circuit measures the charge on the rotating capacitor.

5. The circuit of claim 1, wherein the rotating capacitor comprises a plurality of rotating capacitors and at least one of the plurality of rotating capacitors is electrically coupled to the history capacitor at a given time.

6. The circuit of claim 5, wherein the rotating capacitor electrically coupled to the history capacitor is an active rotating capacitor and the remaining rotating capacitors are inactive rotating capacitors, and the read-out circuit electrically shorts a subset of the inactive rotating capacitors together and measures the resulting charge.

7. The circuit of claim 5, wherein the timing circuit controls the coupling of the rotating capacitors to the history capacitor.

8. The circuit of claim 5, wherein the rotating capacitors are arranged in multiple rotating capacitor banks and at least one rotating capacitor within a single rotating capacitor bank is electrically coupled to the history capacitor at any given time.

9. The circuit of claim 8, wherein the rotating capacitor bank containing at least one rotating capacitor coupled to the history capacitor is referred to as an active rotating capacitor bank and the remaining rotating capacitor banks are referred to as inactive rotating capacitor banks, and read-out circuit electrically shorts a subset of the rotating capacitors within an inactive rotating capacitor bank and measures the resulting charge.

10. The circuit of claim 1 further comprising a pre-charge circuit coupled to the rotating capacitor, the pre-charge unit to place an initial voltage on the rotating capacitor.

11. The circuit of claim 10, wherein the pre-charge unit also resets the charge on the rotating capacitor prior to placing the initial voltage on the rotating capacitor.

12. The circuit of claim 10, wherein the pre-charge unit places the initial voltage on the rotating capacitor by sharing a charge integrated on a feedback capacitor.

13. The circuit of claim 1 further comprising an output circuit coupled to the read-out circuit, the output circuit containing circuitry to produce a discrete-time sample.

14. The circuit of claim 13, wherein the charge on the rotating capacitor is charge shared with a buffer capacitor, and the charge on the buffer capacitor is used to produce the discrete-time sample.

15. The circuit of claim 1 further comprising:
   an output circuit coupled to the read-out circuit, the output circuit containing circuitry to produce a discrete-time sample; and
   a quantizer coupled to the output circuit, the quantizer containing circuitry to convert the discrete-time sample into a digital sample.

16. The circuit of claim 15, wherein the quantizer is a sigma-delta analog-to-digital converter (ADC) and the circuit further comprises an interpolative filter coupled to an output of the quantizer, the interpolative filter to noise shape the digital sample.

17. The circuit of claim 1, wherein the rotating capacitor comprises a plurality of rotating capacitors and at least one but not all of the plurality of rotating capacitors is electrically coupled to the history capacitor at a given time.

18. A radio receiver comprising:
a radio frequency (RF) input to receive RF signals;
a sampling mixer coupled to the RF input to produce a discrete-time sample stream, and the sampling mixer comprising:
a history capacitor and a rotating capacitor, both coupled to a radio frequency (RF) input, the history and rotating capacitors to integrate an RF current provided by the RF input to produce a charge on the history and rotating capacitors;
a read-out circuit coupled to the history and rotating capacitors, the read-out circuit to measure the charge on the rotating capacitor;
a timing circuit coupled to the history and rotating capacitors and the read-out circuit, the timing circuit to produce clock signals to control the operation of the history and rotating capacitors and the read-out circuit; and
the radio receiver further comprising a signal processing unit coupled to the mixer, the signal processing unit containing circuitry to process the output of the sampling mixer and create user usable data.

19. The radio receiver of claim 18, wherein the receiver is used in a wireless communications network.

20. The radio receiver of claim 19, wherein the receiver is used in a global positioning system network.

21. The radio receiver of claim 19, wherein the receiver is used in a broadband communications network.

22. A radio receiver comprising:
a radio frequency (RF) input to receive RF signals;
a sampling mixer coupled to the RF input to produce a discrete-time sample stream, and the sampling mixer comprising:
a history capacitor and a rotating capacitor, both coupled to a radio frequency (RF) input, the history and rotating capacitors to simultaneously integrate an RF current provided by the RF input to produce a charge on the history and rotating capacitors;
a read-out circuit coupled to the rotating capacitors, the read-out circuit to measure the charge on the rotating capacitor;
a timing circuit coupled to the history and rotating capacitors and the read-out circuit, the timing circuit to produce clock signals to control the operation of the history and rotating capacitors and the read-out circuit;
a clock activity detector coupled to the history and rotating capacitors, the clock activity detector containing circuitry to predict an occurrence of a noise glitch; and
a sample predictor coupled to the clock activity detector and the mixer, the sample predictor containing circuitry to predict a value of discrete-time samples corrupted by the digital noise; and
the radio receiver further comprising a signal processing unit coupled to the mixer, the signal processing unit containing circuitry to process the output of the sampling mixer and create user usable data.

23. The radio receiver of claim 22 wherein the clock activity detector asserts a signal line whenever it predicts an occurrence of a noise glitch, and the signal line is provided to circuitry outside of the radio receiver to mark the predicted discrete-time samples.

24. A radio receiver comprising:
a radio frequency (RF) input to receive RF signals;
a sampling mixer coupled to the RF input to produce a discrete-time sample stream, and the sampling mixer comprising:
a history capacitor and a rotating capacitor, both coupled to a radio frequency (RF) input, the history and rotating capacitors to integrate an RF current provided by the RF input to produce a charge on the history and rotating capacitors;
a read-out circuit coupled to the history and rotating capacitors, the read-out circuit to measure the charge on the rotating capacitor;
a timing circuit coupled to the history and rotating capacitors and the read-out circuit, the timing circuit to produce clock signals to control the operation of the history and rotating capacitors and the read-out circuit;
a clock activity detector coupled to the history and rotating capacitors, the clock activity detector containing circuitry to predict an occurrence of a noise glitch;
a sample predictor coupled to the clock activity detector and the mixer, the sample predictor containing circuitry to predict a value of discrete-time samples corrupted by the digital noise;
a delay unit coupled to the mixer, the delay unit containing circuitry to insert a delay of a duration at least equal to a duration of the digital noise into the discrete-time sample stream;
a multiplexer coupled to the delay unit, the sample predictor, and the clock activity detector, the multiplexor to selects between the outputs of the sample predictor and the delay unit; and
the radio receiver further comprising a signal processing unit coupled to the mixer, the signal processing unit containing circuitry to process the output of the sampling mixer and create user usable data.

25. A method for creating a discrete-time sample stream (DTSS) comprising:
receiving a radio frequency (RF) signal;
creating a charge packet from the RF signal;
accumulating the charge packets on a history capacitor and a rotating capacitor, wherein the rotating capacitor is a plurality of rotating capacitors arranged in multiple banks of rotating capacitors, and at least one rotating capacitor is accumulating the charge packets at any given time;
measuring the accumulated charge on the rotating capacitor after a specified number of periods; and
producing a discrete-time sample based on the measured charge.

26. The method of claim 25 wherein the creating step comprises:
converting the RF signal into a RF current; and
gating the RF current to create charge packets.

27. The method of claim 26, wherein the gating step comprises turning a switch on and off using a periodic signal operating at a specified frequency.

28. The method of claim 25 wherein the RF signal is converted into a RF current by a transconductance amplifier.

29. The method of claim 25 further comprising the step of repeating the accumulating, measuring, and producing steps.

30. A method for creating a discrete-time sample stream (DTSS) comprising:
receiving a radio frequency (RF) signal;
creating a charge packet from the RF signal;

accumulating the charge packets on a history capacitor and a plurality of rotating capacitors arranged in multiple banks of rotating capacitors, with at least one rotating capacitor accumulating the charge packets at any given time, the bank of rotating capacitors with the rotating capacitor accumulating the charge packets being an active capacitor bank and the remaining rotating capacitor banks being inactive capacitor banks;

measuring the accumulated charge on a subset of rotating capacitors in an inactive capacitor bank after a specified number of periods; and producing a discrete-time sample based on the measured charge.

31. A method for creating a discrete-time sample stream (DTSS) comprising:

receiving a radio frequency (RF) signal;

creating a charge packet from the RF signal;

accumulating the charge packets on a history capacitor and a rotating capacitor, wherein the charge packets are accumulated simultaneously on the history capacitor and the rotating capacitor;

measuring the accumulated charge on the rotating capacitor after a specified number of periods; and producing a discrete-time sample based on the measured charge.

32. A method for creating a discrete-time sample stream (DTSS) comprising:

receiving a radio frequency (RF) signal;

creating a charge packet from the RF signal;

accumulating the charge packets on a history capacitor and a rotating capacitor, wherein the history and rotating capacitors have different capacitive values;

measuring the accumulated charge on the rotating capacitor after a specified number of periods; and producing a discrete-time sample based on the measured change.

* * * * *